(12) United States Patent
Han et al.

(10) Patent No.: US 12,178,086 B2
(45) Date of Patent: Dec. 24, 2024

(54) DISPLAY SUBSTRATE, PREPARATION METHOD THEREOF, DISPLAY MOTHER PLATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Pengfei Yu, Beijing (CN); Tingliang Liu, Beijing (CN); Yi Zhang, Beijing (CN); Shikai Qin, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 851 days.

(21) Appl. No.: 17/266,622

(22) PCT Filed: Jun. 10, 2020

(86) PCT No.: PCT/CN2020/095426
§ 371 (c)(1),
(2) Date: Feb. 8, 2021

(87) PCT Pub. No.: WO2021/189669
PCT Pub. Date: Sep. 30, 2021

(65) Prior Publication Data
US 2022/0115473 A1    Apr. 14, 2022

(30) Foreign Application Priority Data
Mar. 23, 2020  (WO) ............... PCT/CN2020/080700

(51) Int. Cl.
*H10K 59/124*     (2023.01)
*H10K 50/844*     (2023.01)
(Continued)

(52) U.S. Cl.
CPC ......... *H10K 59/124* (2023.02); *H10K 50/844* (2023.02); *H10K 71/00* (2023.02);
(Continued)

(58) Field of Classification Search
CPC ............... H10K 59/124; H10K 77/111; H10K 2102/351; H10K 71/851; H10K 71/00; H10K 2102/311
See application file for complete search history.

(56) References Cited

U.S. PATENT DOCUMENTS 7,642,711 B2 *   1/2010   Araki ................... H01L 31/102
                                                          313/506
9,287,329 B1 *   3/2016   Lee ....................... H10K 50/86
(Continued)

FOREIGN PATENT DOCUMENTS

CN      103794628 A     5/2014
CN      108281570 A     7/2018
(Continued)

OTHER PUBLICATIONS

European Search Report for 20904243.1 Mailed Jul. 20, 2023.
(Continued)

*Primary Examiner* — Vincent Wall
(74) *Attorney, Agent, or Firm* — Ling Wu; Stephen Yang; Ling and Yang Intellectual Property

(57) ABSTRACT

A method, a network device and a terminal device for transmitting information are provided. The method includes: a network device sends downlink control information to a terminal device through control resource areas in a time domain scheduling unit, wherein the control resource areas include multiple types of control resource areas, different types of control resource areas are used for sending different types downlink control information, and a first type of control resource area in the multiple types of control
(Continued)

resource areas comprises partial frequency domain resources pre-configured or semi-statically configured on each Orthogonal Frequency Division Multiplexing (OFDM) symbol in the time domain scheduling unit.

17 Claims, 16 Drawing Sheets

(51) Int. Cl.
*H10K 59/12* (2023.01)
*H10K 59/131* (2023.01)
*H10K 71/00* (2023.01)
*H10K 77/10* (2023.01)
*H10K 102/00* (2023.01)

(52) U.S. Cl.
CPC ....... *H10K 59/1201* (2023.02); *H10K 59/131* (2023.02); *H10K 71/851* (2023.02); *H10K 77/111* (2023.02); *H10K 2102/311* (2023.02); *H10K 2102/351* (2023.02)

(56) References Cited

U.S. PATENT DOCUMENTS

| | | | |
|---|---|---|---|
| 9,711,542 B2* | 7/2017 | Huang | G02F 1/134363 |
| 10,211,277 B2* | 2/2019 | Lee | H10K 59/1213 |
| 2003/0089991 A1 | 5/2003 | Yamazaki et al. | |
| 2007/0108472 A1* | 5/2007 | Jeong | H01L 29/78603 257/E29.295 |
| 2009/0266471 A1* | 10/2009 | Kim | G02F 1/133305 156/247 |
| 2011/0101853 A1 | 5/2011 | Lee et al. | |
| 2014/0117342 A1* | 5/2014 | Kwon | H10K 77/111 257/40 |
| 2014/0131683 A1* | 5/2014 | Kim | H10K 71/00 438/22 |
| 2014/0138641 A1 | 5/2014 | Yi | |
| 2015/0034935 A1 | 2/2015 | Choi | |
| 2015/0123098 A1* | 5/2015 | Kang | H10K 59/12 438/151 |
| 2015/0280172 A1* | 10/2015 | Nishinohara | H01L 29/78606 257/40 |
| 2015/0356920 A1 | 12/2015 | Na et al. | |
| 2016/0062520 A1 | 3/2016 | Choi | |
| 2017/0040347 A1 | 2/2017 | Seo et al. | |
| 2018/0342707 A1 | 11/2018 | Lee et al. | |
| 2019/0074460 A1* | 3/2019 | Cai | H10K 59/8731 |
| 2019/0095007 A1* | 3/2019 | Jeong | H10K 59/873 |
| 2019/0207160 A1* | 7/2019 | Wang | H10K 50/8445 |
| 2020/0067001 A1 | 2/2020 | Dong et al. | |
| 2020/0395573 A1 | 12/2020 | Zhang et al. | |
| 2021/0126073 A1 | 4/2021 | Xu et al. | |
| 2021/0320276 A1* | 10/2021 | Chang | H10K 50/841 |
| 2021/0335921 A1 | 10/2021 | Zhang | |
| 2021/0358956 A1 | 11/2021 | Ma et al. | |

FOREIGN PATENT DOCUMENTS

| | | | |
|---|---|---|---|
| CN | 108364987 A | 8/2018 | |
| CN | 108807480 A | 11/2018 | |
| CN | 109087999 A | 12/2018 | |
| CN | 109585514 A | 4/2019 | |
| CN | 109638050 A | 4/2019 | |
| CN | 110796949 A | 2/2020 | |
| EP | 3493285 A1 | 6/2019 | |
| GB | 2570795 A | 8/2019 | |
| JP | 2000-124459 A | 4/2000 | |
| JP | 2002-202502 A | 7/2002 | |
| KR | 20150105596 A | 9/2015 | |
| WO | 2019174297 A1 | 9/2019 | |

OTHER PUBLICATIONS

Office Action dated Oct. 31, 2022 for Indian Patent Application No. 202147051896.
Office Action dated Nov. 7, 2022 for Chinese Patent Application No. 202080000959.9 and English Translation.
Office Action dated Dec. 25, 2023 for Vietnamese Patent Application No. 1-2021-07335 and English Translation.
European Search Report for 20904243.1 Mailed Nov. 15, 2023.
European Search Report for 24153913.9 Mailed May 15, 2024.
Office Action dated Apr. 1, 2024 for Japanese Patent Application No. 2021-569177 and English Translation.

\* cited by examiner

DISPLAY SUBSTRATE, PREPARATION METHOD THEREOF, DISPLAY MOTHER PLATE AND DISPLAY DEVICE

CROSS-REFERENCE TO RELATED APPLICATIONS

The present application is a U.S. National Phase Entry of International PCT Application No. PCT/CN2020/095426, which claims priority of International PCT Application No. PCT/CN2020/080700 filed with the CNIPA on Mar. 23, 2020 and entitled "Display Substrate, Preparation Method Thereof, Display Mother Plate and Display Device". The present application claims priority and the benefit of the above-identified applications, and the above-identified applications are incorporated by reference herein in their entirety.

TECHNICAL FIELD

The present disclosure relates to, but is not limited to, the technical field of display, in particular to a display substrate, a preparation method thereof, a display mother plate and a display device.

BACKGROUND

An Organic Light Emitting Diode (abbreviated as OLED) is an active light emitting display component, and has advantages of self-light-emission, wide viewing angle, high contrast, low power consumption, extremely high response speed, etc. With the continuous development of display technology, the OLED technology is increasingly applied in flexible display devices.

At present, a flexible OLED display device is prepared by firstly preparing the display mother plate and then cutting the display mother plate, so that the display mother plate is divided into multiple display substrates, and each of the separated display substrates can be used for forming a single OLED display device. FIG. 1 is a schematic diagram showing an arrangement of multiple display substrates included in a display mother plate. As shown in FIG. 1, multiple substrate regions 300 on the display mother plate 100 are periodically and regularly arranged, and a cutting region 400 is located outside the substrate regions 300. The substrate regions 300 include at least a display region 310 and a binding region 302, wherein the display region 310 includes multiple pixels arranged in a matrix and the binding region 302 includes a fan-out region and a driving circuit, and the binding region 302 is arranged on one side of the display region 310. A first cutting lane 701 and a second cutting lane 702 are provided in the cutting region 400. After all film layers of the display mother plate are prepared, the cutting equipment performs rough cutting along the first cutting lane 701 and fine cutting along the second cutting lane 702 respectively to form a display substrate.

In the existing production, the display substrate has some problems such as a defect of dark spots, which affects the display quality.

SUMMARY

The following is a summary of subject matter described in detail herein. This summary is not intended to limit the protection scope of the claims.

In an aspect, the present disclosure provides a display substrate, which includes a flexible base substrate and a composite insulating layer arranged on the flexible base substrate, wherein an edge region of the display substrate includes a step structure formed by the composite insulating layer; heights of steps in the step structure increase sequentially in a direction from the edge of the display substrate to the inside of the display substrate; the edge region further includes a first flat layer covering the step structure, and the edge of the first flat layer is flush with the edge of the flexible base substrate.

In some possible implementations, the step structure includes a first step, a second step and a third step, wherein thickness of the first step is greater than thickness of the second step, and the thickness of the first step is greater than thickness of the third step.

In some possible implementations, the thickness of the first step is 15 µm to 20.7 µm, the thickness of the second step is 0.2 µm to 1.3 µm, and the thickness of the third step is 0.5 µm to 1.4 µm.

In some possible implementations, the edge region of the display substrate further includes a second flat layer arranged on the first flat layer, and an orthographic projection of the second flat layer on the flexible base substrate partially overlaps with orthographic projections of the first step and the second step on the flexible base substrate.

In some possible implementations, in a direction from the interior of the display substrate to the edge of the display substrate, a width of overlapping between the orthographic projection of the second flat layer on the flexible base substrate and the orthographic projection of the first step on the flexible base substrate is 10 µm to 20 µm, and a width of overlapping between the orthographic projection of the second flat layer on the flexible base substrate and an orthographic projection of the second step on the flexible base substrate is 20 µm to 30 µm.

In some possible implementations, a substrate region of the display substrate includes a first insulating layer arranged on the flexible base substrate, an active layer arranged on the first insulating layer, a second insulating layer covering the active layer, a first metal gate layer arranged on the second insulating layer, a third insulating layer covering the first metal gate layer, a second metal gate layer arranged on the third insulating layer, a fourth insulating layer covering the second metal gate layer, a source-drain metal layer arranged on the fourth insulating layer, a fifth insulating layer covering the source-drain metal layer, a metal conductive layer arranged on the first flat layer, and a second flat layer covering the metal conductive layer.

In some possible implementations, the flexible base substrate includes a first flexible layer, a first barrier layer, an amorphous silicon layer, a second flexible layer and a second barrier layer which are sequentially stacked, wherein the composite insulating layer includes a first insulating layer, a second insulating layer, a third insulating layer, a fourth insulating layer and a fifth insulating layer which are stacked on the second barrier layer; a total thickness of the first flexible layer, the first barrier layer, the amorphous silicon layer and the second flexible layer is 15 µm to 20 µm, a thickness of the second barrier layer is 0.4 µm to 0.7 µm, and a thickness of the first insulating layer is 0.2 µm to 0.6 µm.

In some possible implementations, the second barrier layer includes a first sublayer and a second sublayer stacked on the second flexible layer; the first step includes the first flexible layer, the first barrier layer, the amorphous silicon layer, the second flexible layer and the first sublayer of second barrier layer, the second step includes the second sublayer of the second barrier layer and the first insulating layer, and the third step includes the second insulating layer, the third insulating layer, the fourth insulating layer and the fifth insulating layer; a distance between an upper surface of the first step and a reference surface is 0.05 µm to 0.06 µm, a distance between an upper surface of the second step and the reference surface is 0.75 µm to 0.95 µm, and a distance between an upper surface of the third step and the reference surface may be 1.40 µm to 1.80 µm, wherein the reference surface is a surface of a side of the first sublayer adjacent to the second flexible layer.

In some possible implementations, sidewalls of the second step and the third step are slopes, and an included angle between a generatrix of the slopes and a normal direction of the display substrate is 20 to 50 degrees.

In some possible implementations, a distance from an edge of the first step to an edge of the second step is greater than a distance from the edge of the second step to an edge of the third step, and the distance from the edge of the first step to the edge of the second step is greater than a distance from the edge of the third step to an edge of a crack dam.

In some possible implementations, the distance from the edge of the first step to the edge of the second step is 55 µm to 210 µm, the distance from the edge of the second step to the edge of the third step is 5 µm to 40 µm, the distance from the edge of the third step to the edge of the crack dam is 5 µm to 15 µm.

In some possible implementations, a crack dam is further arranged on the composite insulating layer of the edge region, and the crack dam includes multiple cracks arranged at intervals, the cracks expose the first insulating layer, and the first flat layer covers the crack dam.

In some possible implementations, the edge region of the display substrate includes a peripheral region and an inner cutting region, and the inner cutting region is located on one side of the peripheral region away from the substrate region, the step structure is arranged in the inner cutting region, and the crack dam is arranged in the peripheral region.

In some possible implementations, the substrate region of the display substrate includes a display region and a binding region arranged on one side of the display region, an edge region of the binding region on one side away from the display region forms a stair structure, which includes a first stair and a second stair, the first stair is formed by the flexible base substrate and the composite insulating layer and the second stair is formed by the first flat layer and the second flat layer; the step structure is arranged in other edge regions of the binding region and the display region except the edge region of the binding region on the side away from the display region.

In another aspect, the disclosure also provides a display mother plate, which includes multiple substrate regions and a cutting region surrounding the substrate regions; the display mother plate includes a driving structure layer arranged in the substrate regions and the cutting region, and a first flat layer arranged on the driving structure layer; the driving structure layer of the cutting region includes a composite insulating layer, the composite insulating layer is provided with a groove, and the first flat layer fills the groove.

In some possible implementations, the driving structure layer of the substrate region includes a first insulating layer arranged on a flexible base substrate, an active layer arranged on the first insulating layer, a second insulating layer covering the active layer, a first metal gate layer arranged on the second insulating layer, a third insulating layer covering the first metal gate layer, a second metal gate layer arranged on the third insulating layer, a fourth insulating layer covering the second metal gate layer, a source-drain metal layer arranged on the fourth insulating layer, a fifth insulating layer covering the source-drain metal layer; the driving structure layer of the cutting region includes the first insulating layer, the second insulating layer, the third insulating layer, the fourth insulating layer and the fifth insulating layer stacked on the flexible base substrate; the flexible base substrate includes a first flexible layer, a first barrier layer, an amorphous silicon layer, a second flexible layer and a second barrier layer which are stacked; a total thickness of the first flexible layer, the first barrier layer, the amorphous silicon layer and the second flexible layer is 15 µm to 20 µm, a thickness of the second barrier layer is 0.4 µm to 0.7 µm, and a thickness of the first insulating layer is 0.2 µm to 0.6 µm.

In some possible implementations, the second barrier layer includes a first sublayer and a second sublayer stacked on the second flexible layer; the groove includes a first groove and a second groove, the first groove is arranged on the second sublayer of the second barrier layer and the first insulating layer and exposes the first sublayer of the second barrier layer, the second groove is arranged on the second insulating layer, the third insulating layer, the fourth insulating layer and the fifth insulating layer, and exposes the first sublayer of the second barrier layer and the first insulating layer, an orthographic projection of the second groove on the flexible base substrate includes an orthographic projection of the first groove on the flexible base substrate; a depth of the first groove is 0.2 µm to 1.3 µm, and a depth of the second groove is 0.5 µm to 1.4 µm.

In another aspect, the present disclosure further provides a method for preparing a display substrate, including:

forming a driving structure layer on multiple substrate regions and a cutting region surrounding the substrate regions, wherein the driving structure layer of the cutting region includes a composite insulating layer arranged on a flexible base substrate, and the composite insulating layer forms a groove of a step structure;

forming a first flat layer covering the driving structure layer, wherein the first flat layer fills the groove; and cutting in the cutting region to form a display substrate, and forming a step structure in an edge region of the display substrate; wherein heights of steps in the step structure increase sequentially in a direction from an edge of the display substrate to interior of the display substrate; the first flat layer covers the step structure, and an edge of the first flat layer is flush with an edge of the flexible base substrate.

In some possible implementations, forming the driving structure layer in the cutting region includes:

sequentially forming a first insulating layer, a second insulating layer, a third insulating layer, a fourth insulating layer and a fifth insulating layer on the flexible base substrate; the flexible base substrate includes a first flexible layer, a first barrier layer, an amorphous silicon layer, a second flexible layer and a second barrier layer which are stacked; wherein the second barrier layer includes a first sublayer and a second sublayer stacked on the second flexible layer; and the first insulating layer is formed on a second sublayer of the second barrier layer;

forming a second groove exposing the first insulating layer on the second insulating layer, the third insulating layer, the fourth insulating layer and the fifth insulating layer through a first patterning process; and forming a first groove exposing the first sublayer of the second barrier layer on the second sublayer of the second barrier layer and the first insulating layer in the second groove through a second patterning process, the second groove exposing the first groove.

In another aspect, the present disclosure further provides a display device, including the aforementioned display substrate.

Other aspects will become apparent upon reading and understanding the drawings and the detailed description.

BRIEF DESCRIPTION OF DRAWINGS

Drawings are used provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect true proportions, and the purpose thereof is only for schematically describing contents of the present disclosure.

ILLUSTRATION OF REFERENCE SIGNS

Figure 1:
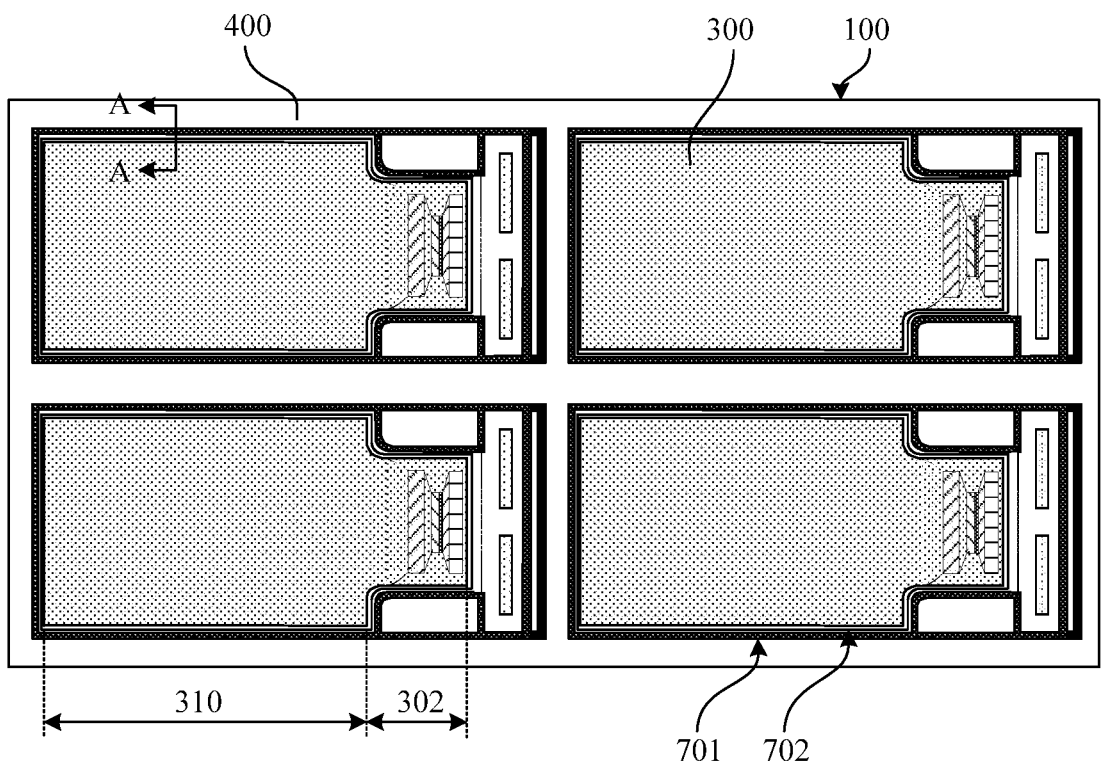
FIG. 1 is a schematic diagram showing an arrangement of multiple display substrates included in a display mother plate.

| Illustration of reference signs: | | |
|---|---|---|
| 1-glass carrier plate; | 10-flexible base substrate; | 10A-first flexible layer; |
| 10B-first barrier layer; | 10C-amorphous silicon layer; | 10D-second flexible layer; |
| 10E-second barrier layer; | 11-first insulating layer; | 12A-first active layer; |
| 12B-second active layer; | 12C-third active layer; | 13-second insulating layer; |
| 14A-first gate electrode; | 14B-second gate electrode; | 14C-third gate electrode; |
| 15-third insulating layer; | 16-fourth insulating layer; | 17A-first source electrode; |
| 17B-second source electrode; | 17C-third source electrode; | 18A-first drain electrode; |
| 18B-second drain electrode; | 18C-third drain electrode; | 19-fifth insulating layer; |
| 20-first flat layer; | 21-second flat layer; | 23-anode; |
| 24-pixel definition layer; | 25-organic light emitting layer; | 26-cathode; |
| 27-packaging layer; | 31-first groove; | 32-second groove; |
| 33-crack dam; | 34-gap; | 41A-first capacitor electrode; |
| 42-second capacitor electrode | 42A-third capacitor electrode; | 42B-fourth capacitor electrode; |
| 51-first step; | 52-second step; | 53-third step; |
| 100-display mother plate; | 101-first transistor; | 102-second transistor; |
| 103-third transistor; | 104A-first storage capacitor; | 104B-second storage capacitor; |
| 105-low voltage line; | 106-first connection electrode; | 107-second connection electrode; |
| 108-third connection electrode; | 201-first dam foundation; | 202-second dam foundation; |
| 203-partition post; | 300-substrate region; | 302-binding region; |
| 303-first fan-out region; | 304-bending region; | 305-second fan-out region; |
| 306-antistatic region; | 307-driving chip region; | 308-binding pin region; |
| 310-display region; | 320-peripheral circuit region; | 330-peripheral region; |
| 400-cutting region; | 410-cutting lane region; | 420-inner cutting region; |
| 430-outer cutting region; | 500-edge region; | 600-array test unit; |
| 701-first cutting line; | 702-second cutting line; | 311-binding circuit region; |
| 312-binding cutting region. | | |

DETAILED DESCRIPTION

To make the objects, technical solutions and advantages of the present disclosure more clear, embodiments of the present disclosure will be described in detail below with reference to the drawings. It should be noted that the embodiments herein may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, sizes of constituent elements, or thicknesses of layers or regions, are sometimes exaggerated for clarity. Therefore, an implementation of the present disclosure is not necessarily limited to the sizes shown. The shape and sizes of components in the drawings do not reflect true proportions. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings such as "central", "upper", "lower", "front", "rear", "vertical", "horizontal", "top", "bottom", "inner", "outer" and the like describe the orientation or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements are appropriately changed according to the direction in which each constituent element is described. Therefore, they are not limited to the wordings in the specification, and may be replaced appropriately according to the situations.

In this specification, terms "installed", "connected" and "coupled" shall be understood in a broad sense unless otherwise explicitly specified and defined. For example, a connection may be fixed connection, or may be detachable connection, or integrated connection; it may be mechanical connection, or may be electrical connection; it may be direct connection, or may be indirect connection through middleware, or may be internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (drain terminal, drain region or drain electrode) and the source electrode (source electrode terminal, source region or source electrode), and current can flow through the drain electrode, channel region and source electrode. It should be noted that in this specification, the channel region refers to a region through which current mainly flows.

In this specification, a first electrode may be a drain electrode and a second electrode may be a source electrode, or the first electrode may be a source electrode and the second electrode may be a drain electrode. The functions of the "source electrode" and the "drain electrode" are sometimes interchanged in cases where transistors with opposite polarities are used or the current direction changes during circuit operation. Therefore, in this specification, "source electrode" and "drain electrode" are interchangeable.

In this specification, an "electrical connection" includes a case where constituent elements are connected together through an element having certain electrical action. The "element having certain electrical action" is not particularly limited as long as it can transmit and receive electrical signals between connected constituent elements. Examples of the "elements having certain electrical action" include not only electrodes and wiring, but also switching elements such as transistors, resistors, inductors, capacitors, and other elements having various functions.

In this specification, "parallel" refers to a state in which two straight lines form an angle above −10 degrees and below 10 degrees, and thus also includes a state in which the angle is above −5 degrees and below 5 degrees. In addition, "perpendicular" refers to a state in which an angle is above 80 degrees and below 100 degrees is formed, and thus also includes a state in which the angle is above 85 degrees and below 95 degrees.

In this specification, "film" and "layer" are interchangeable. For example, sometimes "conductive layer" may be replaced with "conductive film". Similarly, "insulating film" may sometimes be replaced with "insulating layer".

Figure 2:
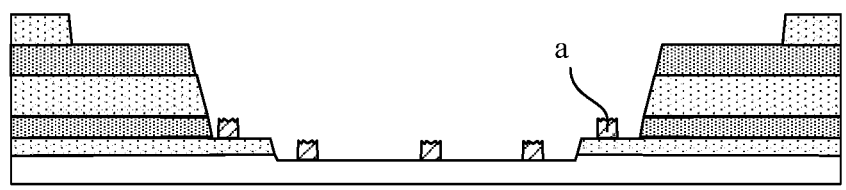
FIG. 2 is a schematic diagram showing metal block residue in a cutting region of a display mother plate.

It is found through research that there are some problems such as the defect of dark spots in display substrates, which are caused by factors such as metal residue and particle pollution in a cutting region during a preparation process. A preparation process of a cutting region of a display substrate includes: forming a first insulating layer, a second insulating layer, a third insulating layer and a fourth insulating layer sequentially on a flexible base substrate, wherein a groove exposing a flexible material layer in the flexible base substrate is formed on the insulating layers of the cutting region in order to reduce the cutting thickness and difficulty of a subsequent cutting process. Then a flat layer is formed, and part of the flat layer in the cutting region is removed to expose the groove. In this way, the film layer in the cutting region forms a stepped groove structure, and a side wall of the groove is a slope. Then a metal thin film is deposited, and the metal thin film is patterned by a patterning process to form a metal conductive layer pattern on the flat layer. Because the stepped groove is formed in the cutting region, not only heights of positions on the deposited metal thin film are different, but also the metal thin film has a large height difference, which leads to incomplete etching of the metal thin film in the patterning process. After the patterning process, as shown in FIG. 2, metal blocks remain on the bottom and step surfaces of the groove. As the metal thin film adopts a laminated structure of titanium/aluminum/titanium (Ti/Al/Ti), when the etching solution of the subsequent process contains silver (Ag) ions, Ag particles will be displaced by the residual metal blocks, and the Ag particles will flow everywhere in the etching solution and adhere. When the Ag particles adhere to a display region, defects such as the defect of dark spots will occur in the display region. In addition, because the deposited metal thin film and the residual metal blocks are in direct contact with the flexible material layer of the flexible base substrate, the metal reacts chemically with the organic material and produces particles, which not only pollute the equipment, but also flow everywhere in the etching solution and attach.

The present disclosure provides a display substrate, which includes a flexible base substrate and a composite insulating layer arranged on the flexible base substrate, wherein an edge region of the display substrate includes a step structure formed by the composite insulating layer; heights of steps in the step structure increase sequentially in a direction from the edge of the display substrate to the interior of the display substrate; the edge region further includes a first flat layer covering the step structure, and the edge of the first flat layer is flush with the edge of the flexible base substrate.

In an exemplary embodiment, the step structure includes a first step, a second step and a third step, wherein thickness of the first step is greater than thickness of the second step, and the thickness of the first step is greater than thickness of the third step.

In an exemplary embodiment, the thickness of the first step is 15 μm to 20.7 μm, the thickness of the second step is 0.2 μm to 1.3 μm, and the thickness of the third step is 0.5 μm to 1.4 μm.

In an exemplary embodiment, a substrate region of the display substrate includes a first insulating layer disposed on the flexible base substrate, an active layer disposed on the first insulating layer, a second insulating layer covering the active layer, a first metal gate layer disposed on the second insulating layer, a third insulating layer covering the first metal gate layer, a second metal gate layer disposed on the third insulating layer, a fourth insulating layer covering the second metal gate layer, a source-drain metal layer disposed on the fourth insulating layer, a fifth insulating layer covering the source-drain metal layer, wherein the first flat layer is disposed on the fifth insulating layer.

In an exemplary embodiment, the substrate region of the display substrate further includes a metal conductive layer disposed on the first flat layer and a second flat layer covering the metal conductive layer.

In an exemplary embodiment, the flexible base substrate includes a first flexible layer, a first barrier layer, an amorphous silicon layer, a second flexible layer and a second barrier layer which are sequentially stacked, wherein the second barrier layer includes a first sublayer and a second sublayer stacked on the second flexible layer; the composite insulating layer includes a first insulating layer, a second insulating layer, a third insulating layer, a fourth insulating layer and a fifth insulating layer which are stacked on the second sublayer of the second barrier layer; a total thickness of the first flexible layer, the first barrier layer, the amorphous silicon layer and the second flexible layer is 15 μm to 20 μm, a thickness of the second barrier layer is 0.4 μm to 0.7 μm, and a thickness of the first insulating layer is 0.2 μm to 0.6 μm; the step structure includes a first step formed by the first flexible layer, the first barrier layer, the amorphous silicon layer, the second flexible layer and the first sublayer of second barrier layer, a second step formed by the second sublayer of the second barrier layer and the first insulating layer, and a third step formed by the second insulating layer, the third insulating layer, the fourth insulating layer and the fifth insulating layer, wherein heights of the first step, the second step and the third step increase in a direction from the first step to the third step.

In an exemplary embodiment, a distance between an upper surface of the first step and a reference surface is 0.05 μm to 0.06 μm, a distance between an upper surface of the second step and the reference surface is 0.75 μm to 0.95 μm, and a distance between an upper surface of the third step and the reference surface may be 1.40 μm to 1.80 μm, wherein the reference surface is a surface of the first sublayer adjacent to the second flexible layer.

In an exemplary embodiment, side walls of the second step and the third step are slopes, and the included angle between the generatrix of the slopes and the normal direction of the display substrate is 20 to 50 degrees.

In an exemplary embodiment, a crack dam is further arranged on the composite insulating layer of the edge region, wherein the crack dam includes multiple cracks arranged at intervals, and the cracks expose the first insulating layer, and the first flat layer covers the crack dam.

In an exemplary embodiment, the display substrate includes a substrate region and an edge region, wherein the edge region includes a peripheral region and an inner cutting region, and the inner cutting region is located on one side of the peripheral region away from the substrate region. The step structure is arranged in the inner cutting region, and the crack dam is arranged in the peripheral region.

In an exemplary embodiment, the substrate region includes a display region and a binding region arranged on one side of the display region, wherein an edge region of the binding region away from the display region forms a stair structure, which includes a first stair and a second stair. The first stair is formed by a flexible base substrate and a composite insulating layer, and the second stair is formed by a first flat layer and a second flat layer. The step structure is arranged in other edge regions of the binding region and the display region except the edge region of the binding region on the side away from the display region.

Figure 3:
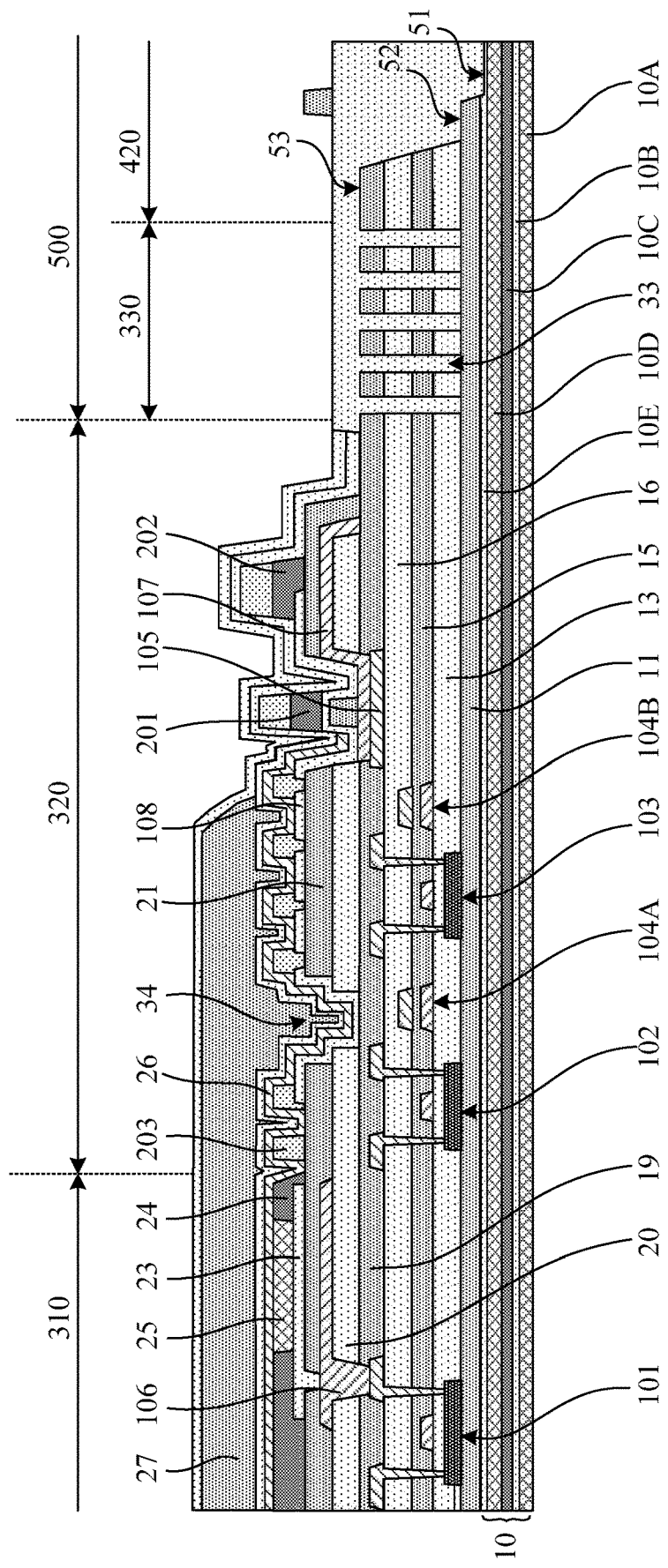
FIG. 3 is a schematic diagram of a structure of a display mother plate according to the present disclosure.

FIG. 3 is a schematic diagram of a structure of a display substrate according to the present disclosure, which is a cross-sectional view taken along A-A in FIG. 1, and illustrates a cross-sectional structure of a substrate region and a cutting region of a double source-drain metal layer (double SD or 2SD) structure. Please refer to FIG. 3 to FIG. 16, in a plane direction parallel to the display substrate, the display substrate includes a display region 310, a peripheral circuit region 320 and an edge region 500, wherein the edge region 500 includes a peripheral region 330 and an inner cutting region 420, and the inner cutting region 420 is located on one side of the peripheral region 330 away from the display region 310. As shown in FIG. 3, in a plane direction perpendicular to the display substrate, the display substrate according to the present disclosure includes a flexible base substrate 10, a driving structure layer 101, 102, 103, 104A and 104B disposed on the flexible base substrate 10, a first flat layer 20 disposed on the driving structure layer, a metal conductive layer 106 and 107 disposed on the first flat layer 20, and a second flat layer 21 covering the metal conductive layer. The driving structure layer 101 of the display region 310 includes multiple transistors 101 forming a pixel driving circuit 101, 102, 103, 104A, 104B and 105, and the driving structure layer 102, 103, 104A and 104B of the peripheral circuit region 320 includes multiple transistors 102 and 103 and storage capacitors 104A and 104B forming a peripheral circuit 302, which are illustrated by taking three transistors and two storage capacitors as an example in FIG. 3. The driving structure layer 11, 13, 15, 16 and 19 of the edge region 500 includes a composite insulating layer 11, 13, 15, 16 and 19 composed of multiple inorganic insulating layers 11, 13, 15, 16 and 19, wherein the composite insulating layer is provided with a step structure 51, 52 and 53 and a crack dam 33, and the first flat layer 20 of the edge region 500 covers and fills the step structure 51, 52 and 53 and the crack dam 33.

In an exemplary embodiment, the driving structure layers of the display region 310 and the peripheral circuit region 320 may include a first insulating layer 11 disposed on the flexible base substrate 10, an active layer 12A, 12B and 12C disposed on the first insulating layer 11, a second insulating layer 13 covering the active layer, a first metal gate layer 14A, 14B, 14C, 41A and 41B disposed on the second insulating layer 13, a third insulating layer 15 covering the first metal gate layer, a second metal gate layer 42A and 42B disposed on the third insulating layer 15, a fourth insulating layer 16 covering the second metal gate layer, a source-drain metal layer 17A, 18A, 17B, 18B, 17C, 18C and 105 disposed on the fourth insulating layer 16, a fifth insulating layer 19 covering the source-drain metal layer. The active layer includes at least a first active layer 12A, a second active layer 12B, and a third active layer 12C. The first metal gate layer includes at least a first gate electrode 14A, a second gate electrode 14B, a third gate electrode 14C, a first capacitor electrode 41A and a second capacitor electrode 41B, the second metal gate layer includes at least a third capacitor electrode 42A and a fourth capacitor electrode 42B, and the source-drain metal layer includes at least a first source electrode 17A, a first drain electrode 18A, a second source electrode 17B, a second drain electrode 18B, a third source electrode 17C, a third drain electrode 18C and a low voltage line 105. The first active layer 12A, the first gate electrode 14A, the first source electrode 17A and the first drain electrode 18A form a first transistor 101, the second active layer 12B, the second gate electrode 14B, the second source electrode 17B and the second drain electrode 18B form a second transistor 102, the third active layer 12C, the third gate electrode 14C, the third source electrode 17C and the third drain electrode 18C form a third transistor 103, the first capacitor electrode 41A and the third capacitor electrode 42A form a first storage capacitor 104A, and the second capacitor electrode 41B and the fourth capacitor electrode 42B form a second storage capacitor 104B. The display region 310 and the peripheral circuit region 320 further include light emitting structure layers 106, 107, 21, 23, 108, 24, 25, 26 and 27, wherein each light emitting structure layer includes a metal conductive layer 106 and 107 disposed on the first flat layer 20, a second flat layer 21 covering the metal conductive layer, an anode 23 and a third connection electrode 108 which are disposed on the second flat layer 21, a pixel defining layer 24, an organic light emitting layer 25, a cathode 26 and an encapsulation layer 27. The metal conductive layer includes at least a first connection electrode 106 and a second connection electrode 107.

In an exemplary embodiment, the driving structure layer of the edge region 500 may include the first insulating layer 11, the second insulating layer 13, the third insulating layer 15, the fourth insulating layer 16, and the fifth insulating layer 19 which are sequentially stacked on the flexible base substrate 10, all of the above insulating layers are inorganic insulating layers and serves as the composite insulating layer of the present disclosure. The step structure 51, 52 and 53 is arranged in the inner cutting region 420, and the crack dam 33 is arranged in the peripheral region 330. The inner cutting region 420 in the edge region 500, the flexible base substrate 10 and the composite insulating layer together form the step structure of the present disclosure. The step structure includes a first step 51 formed by a first flexible layer 10A, the first barrier layer 10B, an amorphous silicon layer 10C, a second flexible layer 10D and a first sublayer of a second barrier layer 10E of the flexible base substrate 10, a second step 52 formed by the second sublayer of the second barrier layer 10E and the first insulating layer 11, and a third step 53 formed by the second insulating layer 13, the third insulating layer 15, the fourth insulating layer 16 and the fifth insulating layer 19. The heights of the first step 51, the second step 52 and the third step 53 increase sequentially in a direction from the inner cutting region 420 (edge of the display substrate) to the display region 310 (interior of display substrate), that is, the heights of the first step 51, the second step 52 and the third step 53 increase sequentially in the direction from the first step 51 to the third step 53. In the present disclosure, the height of each step refers to a distance between the step surface and a lower surface of the flexible base substrate. The first flat layer 20 of the inner cutting region 420 covers the above step structure, and an edge of the first flat layer 20 on a side away from the display region 310 is flush with the edge of the flexible base substrate 10. In the peripheral region 330 in the edge region 500, the composite insulating layer is provided with a crack dam 33, wherein the crack dam 33 includes multiple cracks which are arranged at intervals in the composite insulating layer, and the second insulating layer 13, the third insulating layer 15, the fourth insulating layer 16 and the fifth insulating layer 19 in the cracks are removed so as to expose surface of the first insulating layer 11. The first flat layer 20 of the peripheral region 330 covers the crack dam 33 and fills the multiple cracks arranged at intervals in the crack dam 33, and the surface of the first flat layer 20 of the peripheral region 330 is substantially flush with the surface of the first flat layer 20 of the inner cutting region 420.

A structure of a display substrate according to the present disclosure is described below by an example of a preparation process of a display substrate. The "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured from a certain material on a base substrate by using deposition or coating process. If the "thin film" does not need a patterning process during the whole manufacturing process, the "thin film" can also be called a "layer". When the "thin film" needs a patterning process during the whole manufacturing process, it is called "thin film" before the patterning process and called "layer" after the patterning process. The "layer" after the patterning process contains at least one "pattern". In the present disclosure, "a and b are arranged on the same layer" means that a and b are formed at the same time by the same patterning process. "An orthographic projection of A including an orthographic projection of B" means that a boundary of the orthographic projection of B falls within a range of boundary of the orthographic projection of A, or the boundary of the orthographic projection of A overlaps with the boundary of the orthographic projection of B.

Since in the preparation process of the display substrate according to the present disclosure, a display mother plate is first prepared and then the display mother plate is cut into multiple display substrates, therefore in the following description, the substrate before the cutting is called the display mother plate and the substrate after the cutting is called the display substrate. The display mother plate includes a substrate region 300 and a cutting region 400 located at the periphery of the substrate region 300.

Figure 4:
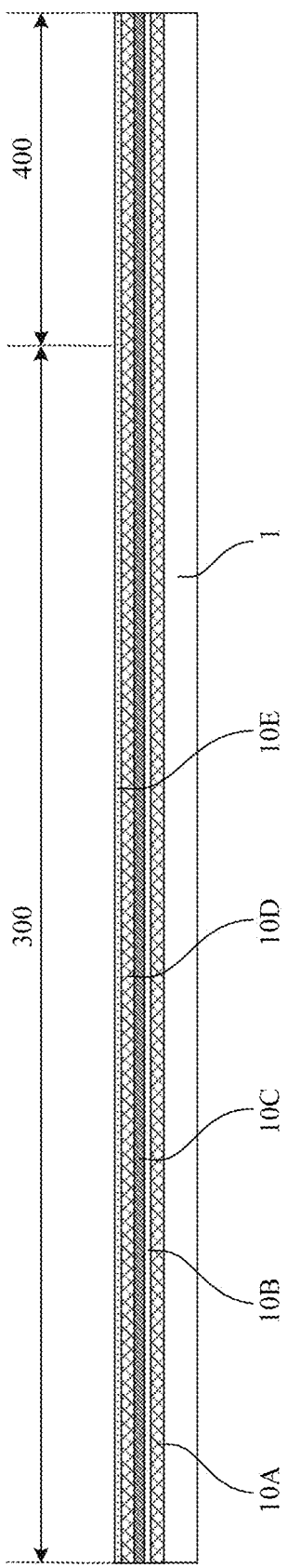
FIG. 4 is a schematic diagram of a structure after a flexible base substrate is formed according to the present disclosure.

(1) A flexible base substrate 10 is prepared on a glass carrier plate 1. In the present disclosure, the flexible base substrate 10 includes a first flexible material layer 10A, a first inorganic material layer 10B, a semiconductor layer 10C, a second flexible material layer 10D and a second inorganic material layer 10E stacked on the glass carrier plate 1. Material of the first flexible material layer and the second flexible material layer may be polyimide (PI), polyethylene terephthalate (PET) or polymer soft film after surface treatment, and material of the first inorganic material layer and the second inorganic material layer may be silicon nitride (SiNx) or silicon oxide (SiOx) to improve the water and oxygen resistance capability of the base substrate. The first inorganic material layer and the second inorganic material layers may be called Barrier layers, and amorphous silicon (a-si) may be used as the material of the semiconductor layer. In an exemplary embodiment, taking a laminated structure PI1/Barrier1/a-si/PI2/Barrier2 as an example, the preparation process may include: first coating a layer of polyimide on the glass carrier plate 1, and then forming a first flexible (PI1) layer 10A after the polyimide is cured and forms a film; then, depositing a barrier thin film on the first flexible layer 10A to form a first barrier layer 10B covering the first flexible layer 10A; then, depositing an amorphous silicon thin film on the first barrier layer 10B to form an amorphous silicon (a-si) layer 10C covering the first barrier layer 10B; then, coating a layer of polyimide on the amorphous silicon layer 10C, and forming a second flexible (PI2) layer 10D after the polyimide is cured and forms a layer; then, depositing a barrier thin film on the second flexible layer 10D to form a second barrier (Barrier2) layer 10E covering the second flexible layer 10D, thus completing the preparation of the flexible base substrate 10, which is as shown in FIG. 4. After this process, both the substrate region 300 and the cutting region 400 include the flexible base substrate 10.

In an exemplary embodiment, a total thickness of the first flexible layer 10A, the first barrier layer 10B, the amorphous silicon layer 10C and the second flexible layer 10D may be 15 μm to 20 μm, and a thickness of the second barrier layer 10E may be 0.4 μm to 0.7 μm. In some possible implementations, the total thickness of the first flexible layer 10A, the first barrier layer 10B, the amorphous silicon layer 10C and the second flexible layer 10D may be 17.6 μm, and the thickness of the second barrier layer 10E may be 0.55 μm. In the present disclosure, a thickness refers to a distance between an upper surface and a lower surface of a film layer.

(2) A driving structure layer pattern is prepared on the flexible base substrate 10. A driving structure layer of the substrate region 300 includes a first transistor 101, a second transistor 102, a third transistor 103, a first storage capacitor 104A, a second storage capacitor 104B and a low voltage line 105 which form a pixel driving circuit, and a driving structure layer of the cutting region 400 includes a composite insulating layer formed by multiple inorganic insulating layers, on which a groove for exposing the second flexible layer 10D of the flexible base substrate 10 is formed. In an exemplary embodiment, the preparation process of the driving structure layer may include:

A first insulating thin film and an active layer thin film are sequentially deposited on the flexible base substrate 10, and the active layer thin film is patterned by a patterning process to form a first insulating layer 11 covering the entire flexible base substrate 10 and an active layer pattern arranged on the first insulating layer 11, wherein the active layer pattern is formed in the substrate region 300 and includes at least a first active layer 12A, a second active layer 12B and a third active layer 12C. After this patterning process, the cutting region 400 includes the first insulating layer 11 disposed on the flexible base substrate 10.

In an exemplary embodiment, the thickness of the first insulating layer 11 may be 0.2 μm to 0.6 μm. In some possible implementations, the thickness of the first insulating layer 11 may be 0.4 μm.

Then, a second insulating thin film and a first metal thin film are sequentially deposited, and the first metal thin film is patterned by the patterning process to form a second insulating layer 13 covering the active layer pattern and a first metal gate layer pattern arranged on the second insulating layer 13, wherein the first metal gate layer pattern is formed in the substrate region 300 and includes at least a first gate electrode 14A, a second gate electrode 14B, a third gate electrode 14C, a first capacitor electrode 41A, a second capacitor electrode 41B, multiple gate lines (not shown) and multiple gate leads (not shown). After this patterning process, the cutting region 400 includes the first insulating layer 11 and the second insulating layer 13 stacked on the flexible base substrate 10.

Then, a third insulating thin film and a second metal thin film are sequentially deposited, and the second metal thin film is patterned by the patterning process to form a third insulating layer 15 covering the first metal gate layer and a second metal gate layer pattern arranged on the third insulating layer 15, wherein the second metal gate layer pattern is formed in the substrate region 300 and includes at least a third capacitor electrode 42A, a fourth capacitor electrode 42B and a second gate lead (not shown). The position of the third capacitor electrode 42A corresponds to the position of the first capacitor electrode 41A, and the position of the fourth capacitor electrode 42B corresponds to the position of the second capacitor electrode 41B. After this patterning process, the cutting region 400 includes the first insulating layer 11, the second insulating layer 13 and the third insulating layer 15 stacked on the flexible base substrate 10.

Then, a fourth insulating thin film is deposited and patterned by the patterning process to form a pattern of a fourth insulating layer 16 covering the second metal gate layer, wherein the fourth insulating layer 16 is provided thereon with multiple first via holes, and the multiple first via holes are formed in the substrate region 300 at positions corresponding to two ends of the first active layer 12A, the second active layer 12B and the third active layer 12C. The fourth insulating layer 16, the third insulating layer 15 and the second insulating layer 13 in the multiple first via holes are etched to respectively expose surfaces of the first active layer 12A, the second active layer 12B and the third active layer 12C. After this patterning process, the cutting region 400 includes the first insulating layer 11, the second insulating layer 13, the third insulating layer 15 and the fourth insulating layer 16 stacked on the flexible base substrate 10.

Then, a third metal thin film is deposited and patterned by the patterning process to form a source-drain metal layer pattern on the fourth insulating layer 16, and the source-drain metal layer is formed in the substrate region 300 and includes at least a first source electrode 17A, a first drain electrode 18A, a second source electrode 17B, a third source electrode 17C, a third drain electrode 17C, a low voltage (VSS) line 105, multiple data lines (not shown) and multiple data lead patterns. The first source electrode 17A and the first drain electrode 17B are respectively connected with the first active layer 12A through the first via holes, the second source electrode 17B and the second drain electrode 17B are respectively connected with the second active layer 12B through the first via holes, and the third source electrode 17C and the third drain electrode 17C are respectively connected with the third active layer 12C through the first via holes. In an exemplary embodiment, according to actual needs, the source-drain metal layer may also include any one or more of a power supply line (VDD), a compensation line and an auxiliary cathode, and the source-drain metal layer is also called a first source-drain metal layer (SD1). After this patterning process, the cutting region 400 includes the first insulating layer 11, the second insulating layer 13, the third insulating layer 15 and the fourth insulating layer 16 stacked on the flexible base substrate 10.

Then, a fifth insulating thin film is deposited to form a fifth insulating layer 19 pattern covering the source-drain metal layer. After this patterning process, the cutting region 400 includes a composite insulating layer disposed on the flexible base substrate 10, wherein the composite insulating layer includes a first insulating layer 11, a second insulating layer 13, a third insulating layer 15, a fourth insulating layer 16 and a fifth insulating layer 19.

Figure 5:
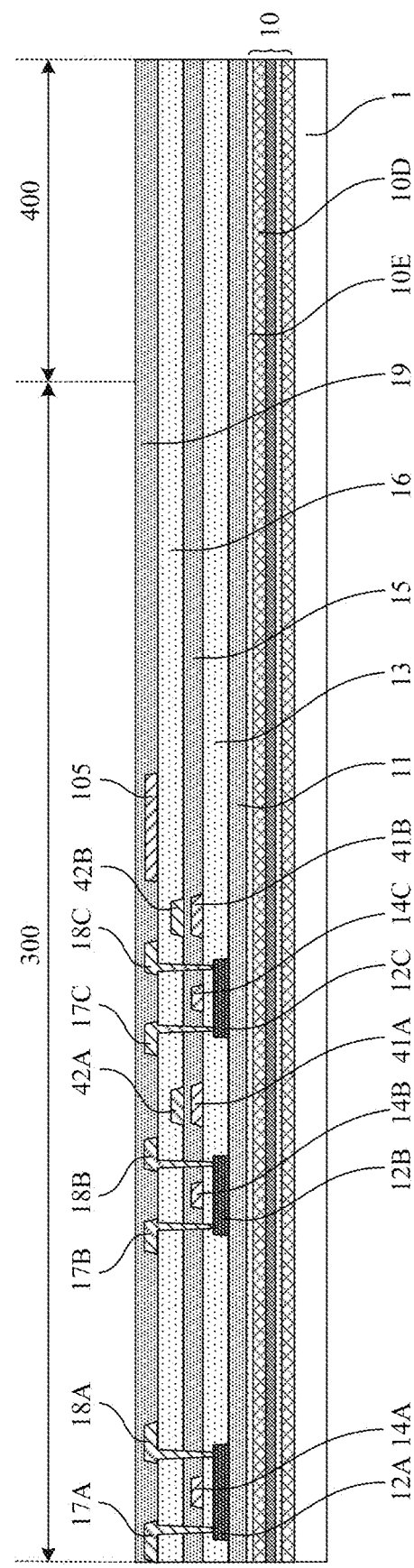
FIG. 5 is a schematic diagram of a structure after a pattern of a driving structure layer is formed according to the present disclosure.

At this point, the driving structure layer pattern is prepared on the flexible base substrate 10, which is as shown in FIG. 5. The first active layer 12A, the first gate electrode 14A, the first source electrode 17A and the first drain electrode 18A constitute a first transistor 101, the second active layer 12B, the second gate electrode 14B, the second source electrode 17B and second drain electrode 18B constitute a second transistor 102, and the third active layer 12C, the third gate electrode 14C, the third source electrode 17C and the third drain electrode 18C constitute a third transistor 103. The first capacitor electrode 41A and the third capacitor electrode 42A constitute a first storage capacitor 104A, the second capacitor electrode 42B and the fourth capacitor electrode 42B constitute a second storage capacitor 104B, and the multiple gate leads and data leads constitute driving leads for Gate Driver on Array (abbreviated as GOA) of the substrate. In an exemplary embodiment, the first transistor 101 may be a driving transistor in a pixel driving circuit, the second transistor 102 may be a scanning transistor for outputting a scan signal in a GOA, the third transistor 103 may be an enabling transistor for outputting an enable (EM) signal in a GOA, wherein the driving transistor, scanning transistor and enabling transistor may each be a thin film transistor (TFT).

Figure 6:
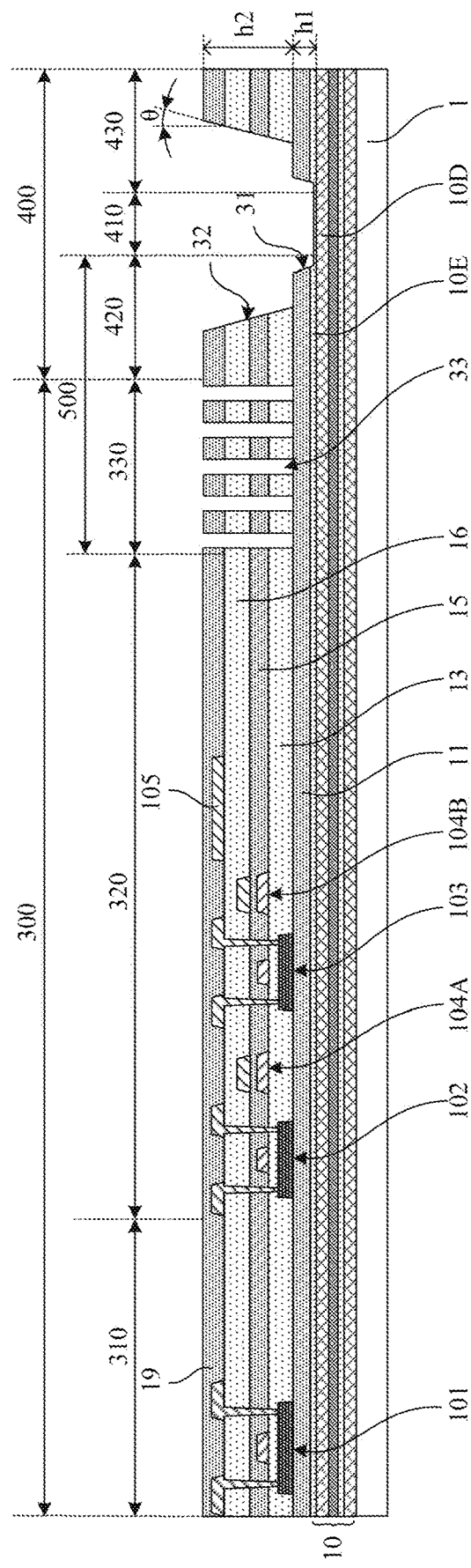
FIG. 6 is a schematic diagram of a structure after grooves and a crack dam are formed according to the present disclosure.

(3) The composite insulating layer of the cutting region 400 and the substrate region 300 adjacent to the cutting region 400 is patterned by a patterning process to form a first groove 31 and a second groove 32 in the cutting region 400 and form a crack dam 33 in the substrate region 300, which are as shown in FIG. 6. In the present disclosure, the substrate region 300 may be divided into a display region 310, a peripheral circuit region 320 and a peripheral region 330, wherein the peripheral region 330 is adjacent to the cutting region 400, the display region 310 is located on one side of the peripheral region 330 away from the cutting region 400, and the peripheral circuit region 320 is located between the display region 310 and the peripheral region 330. The cutting region 400 may be divided into a cutting lane region 410, an inner cutting region 420 and an outer cutting region 430, wherein the cutting lane region 410 is located in the middle of the cutting region 400, which is a region where cuts are formed when cutting the display mother plate. The inner cutting region 420 is located on one side of the cutting lane region 410 adjacent to the substrate region 300, and the outer cutting region 430 is located on one side of the cutting lane region 410 away from the substrate region 300. After the display mother plate is cut to form the display substrate, the cutting lane region 410 and the outer cutting region 430 are cut away, and the inner cutting region 420 is retained. In this way, for the prepared display substrate, the peripheral region 330 of the substrate region 300 and the inner cutting region 420 of the cutting region 400 constitute the edge region 500 of the display substrate, which is as shown in FIG. 6.

In the present disclosure, after the first groove 31 and the second groove 32 are formed in the cutting region 400, the first groove 31 exposes the second barrier layer 10E of the flexible base substrate 10, and the second groove 32 exposes the first groove 31, that is, the orthographic projection of the first groove 31 on the flexible base substrate 10 contains the front projection of the second groove 32 on the flexible base substrate 10. In the following description, the first groove 31 and the second groove 32 are called grooves. The crack dam 33 is formed in the peripheral region 330 of the substrate region 300, that is, in the edge region 500, and includes multiple cracks arranged at intervals, wherein each of the cracks exposes the surface of the first insulating layer 11, which is as shown in FIG. 6. After this patterning process, the cutting region 400 includes the composite insulating layer which is arranged on the flexible base substrate 10 and has grooves, in which the widths of the first groove 31 and the second groove 32 are both larger than the width of the cutting lane region 410.

In an exemplary embodiment, the first groove 31, the second groove 32 and the crack dam 33 may be formed by two times of patterning processes. The fifth insulating layer 19, the fourth insulating layer 16, the third insulating layer 15 and the second insulating layer 13 of the cutting region 400 and the peripheral region 330 are etched through an Etch Bending A MASK (EBA MASK for short), and to form the second groove 32 on the second insulating layer 13, the third insulating layer 15, the fourth insulating layer 16 and the fifth insulating layer 19 of the cutting region 400. The crack dam 33 is formed on the second insulating layer 13, the third insulating layer 15, the fourth insulating layer 16, and the fifth insulating layer 19 of the peripheral region 330, and the fifth insulating layer 19, the fourth insulating layer 16, the third insulating layer 15, and the second insulating layer 13 in the second groove 32 and the crack dam 33 are etched away to expose the surface of the first insulating layer 11. Then, the first insulating layer 11 in the second groove 32 in the cutting region 400 and the second sublayer of the second barrier layer 10E of the flexible base substrate 10 are etched through an Etch Bending B MASK (EBB MASK for short) to form the first groove 31 on the second sublayer of the second barrier layer 10E and the first insulating layer 11. The first insulating layer 11 and the second sublayer of the second barrier layer 10E in the first groove 31 are etched away to expose the surface of the first sublayer of the second barrier layer 10E of the flexible base substrate 10 In this way, in the cutting region 400, the second groove 32 exposes the first groove 31, that is, the first insulating layer 11 and the first sublayer of the second barrier layer 10E of the flexible base substrate, and the first groove 31 exposes the first sublayer of the second barrier layer 10E of the flexible base substrate 10, forming a stepped groove structure. In an exemplary embodiment, the second barrier layer 10E may be understood as being composed of the stacked first sublayer and second sublayer, wherein the first sublayer is disposed on the second flexible layer 10D, the second sublayer is disposed on the first sublayer, and the first insulating layer 11 is disposed on the second sublayer. In the EBB MASK process, the second sublayer in the second groove 32 is etched away and the first sublayer is retained, that is, the formed first groove 31 is formed on the first insulating layer 11 and part of thickness of the second barrier layer 10E. In some possible implementations, the first sublayer is called a residual part of the second barrier layer 10E, and the second sublayer is called an etched part of the second barrier layer 10E. In the peripheral region 330, the multiple cracks arranged at intervals expose the surface of the first insulating layer 11, forming a crack dam structure in a concave-convex shape. The EBA MASK and EBB MASK processes are patterning processes for trenching a bending region of the display mother plate to reduce the thickness of the bending region. In the present disclosure, the crack dam structure in the concave-convex shape formed in the peripheral region 330 is a film layer structure for avoiding affecting the display region 310 and the peripheral circuit region 320 during the cutting process of the display mother plate. The multiple cracks arranged at intervals can not only reduce the stress on the display region 310 and the peripheral circuit region 320, but also can cut off transmission of cracks in a direction towards the display region 310 and the peripheral circuit region 320.

In an exemplary embodiment, in a process of forming the first groove 31 and the second groove 32 by using the EBA MASK and EBB MASK processes, inner sidewalls of the first groove 31 and the second groove 32 may be made to be slopes by setting process parameters, and an included angle θ between the generatrix of the slopes and the normal direction of the display substrate is 20 to 50 degrees. In an exemplary embodiment, a depth h1 of the first groove 31 is smaller than a depth h2 of the second groove 32. In some possible implementations, the depth h1 of the first groove 31 (i.e., the thickness of the second step) may be 0.2 μm to 1.3 μm, and the depth h2 of the second groove 32 (i.e., the thickness of the third step) may be 0.5 μm to 1.4 μm.

Figure 7:
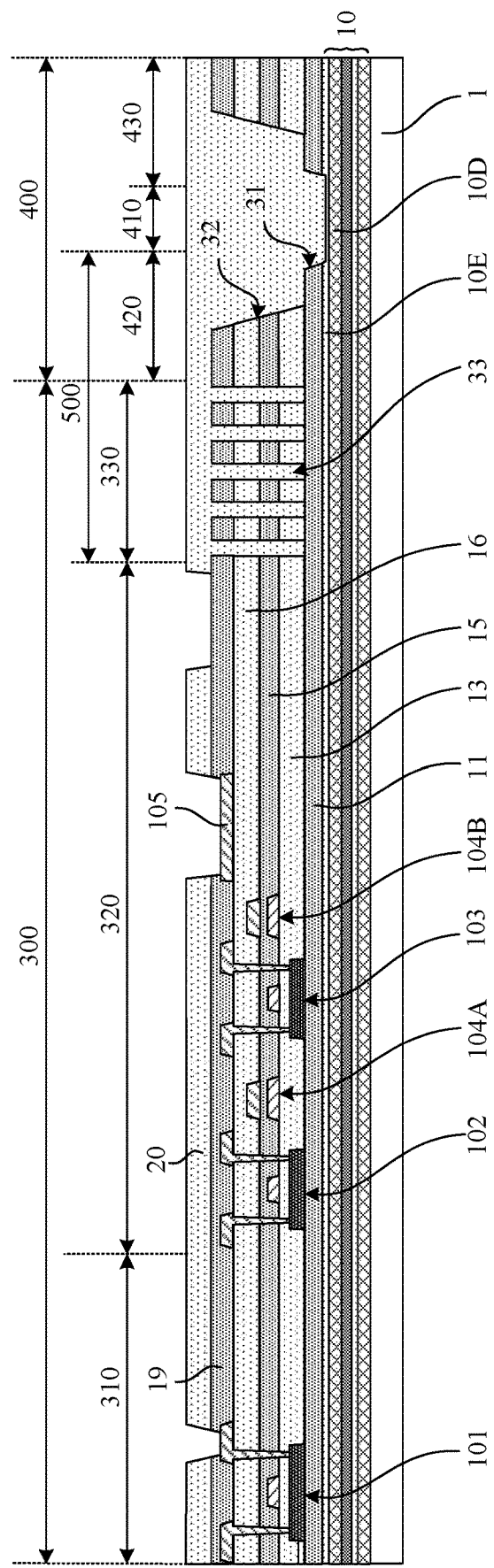
FIG. 7 is a schematic diagram of a structure after a pattern of a first flat layer is formed according to the present disclosure.

(4) A first flat thin film is coated on the flexible base substrate with the above pattern to form a first planarization (PLN) layer 20 covering the entire flexible base substrate 10, a second via hole, a third via hole and a partition are formed on the first flat layer 20 through a patterning process, wherein the second via hole is formed in the display region 310, and the first flat layer 20 and the fifth insulating layer 19 in the second via hole are etched away to expose a surface of the first drain electrode of the first transistor 101. The third via hole and the partition are formed in the peripheral circuit region 320, and the first flat layer 20 and the fifth insulating layer 19 in the third via hole are etched away to expose a surface of the low voltage line 105. The first flat layer 20 in the partition is developed away to expose a surface of the fifth insulating layer 19. In the peripheral region 330 of the substrate region 300, the first flat layer 20 completely fills the cracks in the crack dam 33. In the cutting region 400, the first flat layer 20 completely fills the first groove 31 and the second groove 32, and has a relatively flat surface, that is, the surface of the first flat layer 20 of the cutting region 400 on the side far away from the flexible base substrate 10 is relatively flat, which is as shown in FIG. 7. In an exemplary embodiment, a thickness of the first planarization layer 20 may be 0.8 μm to 1.5 μm. After this patterning process, the cutting region 400 includes the composite insulating layer which is arranged on the flexible base substrate 10 and has grooves and the first flat layer 20 arranged on the composite insulating layer and filling the grooves. In the present disclosure, when the partition is formed in the substrate region 300 for subsequent packaging, the inorganic layer in the packaging layer directly contacts the fifth insulating layer 19 and the fourth insulating layer 16, thus ensuring the packaging effect and process quality.

Figure 8:
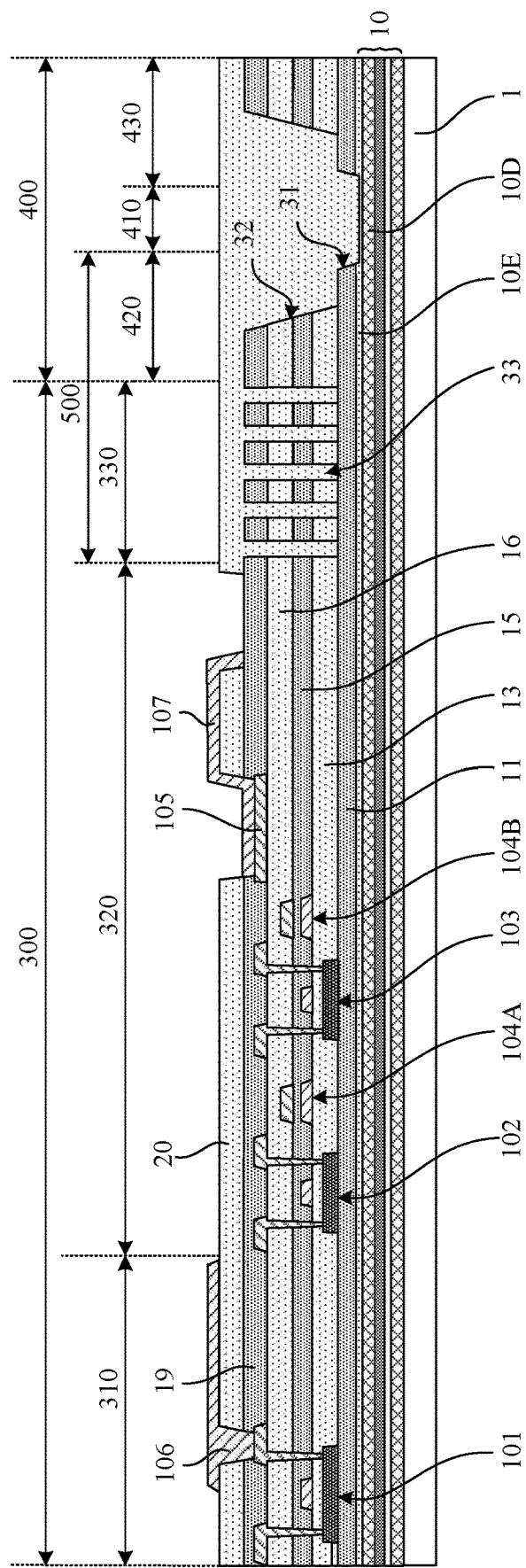
FIG. 8 is a schematic diagram of a structure after a pattern of a metal conductive layer is formed according to the present disclosure.

(5) A fourth metal thin film is deposited on the flexible base substrate with the above pattern, the fourth metal thin film is patterned through a patterning process to form a pattern of metal conductive layer on the first flat layer 20, wherein the metal conductive layer includes at least a first connection electrode 106 and a second connection electrode 107, and the first connection electrode 106 is arranged in the display region 310 and connected with the first drain electrode of the first transistor 101 through the second via hole. The second connection electrode 107 is disposed in the peripheral circuit region 320, and connected with the low voltage line 105 through the third via hole, and extends toward the peripheral region 330, covering the first flat layer 20 between the third via hole and the partition, which is as shown in FIG. 8. In an exemplary embodiment, the metal conductive layer is also called the second source-drain metal layer (SD2). According to the actual design, the metal conductive layer can also include any one or more of a power line, a power lead, a low-voltage lead and an auxiliary cathode. The cutting region 400 may also be provided with the metal conductive layer, such as a signal line for testing. In this patterning process, since the grooves of the cutting region 400 is filled by the first flat layer 20 and the fourth metal thin film is formed on a flat surface of the first flat layer 20, the height difference between positions on the fourth metal thin film in the cutting region 400 is eliminated, thus avoiding a case of incomplete etching of the metal thin film, and no metal block will remain after the patterning process.

Figure 9:
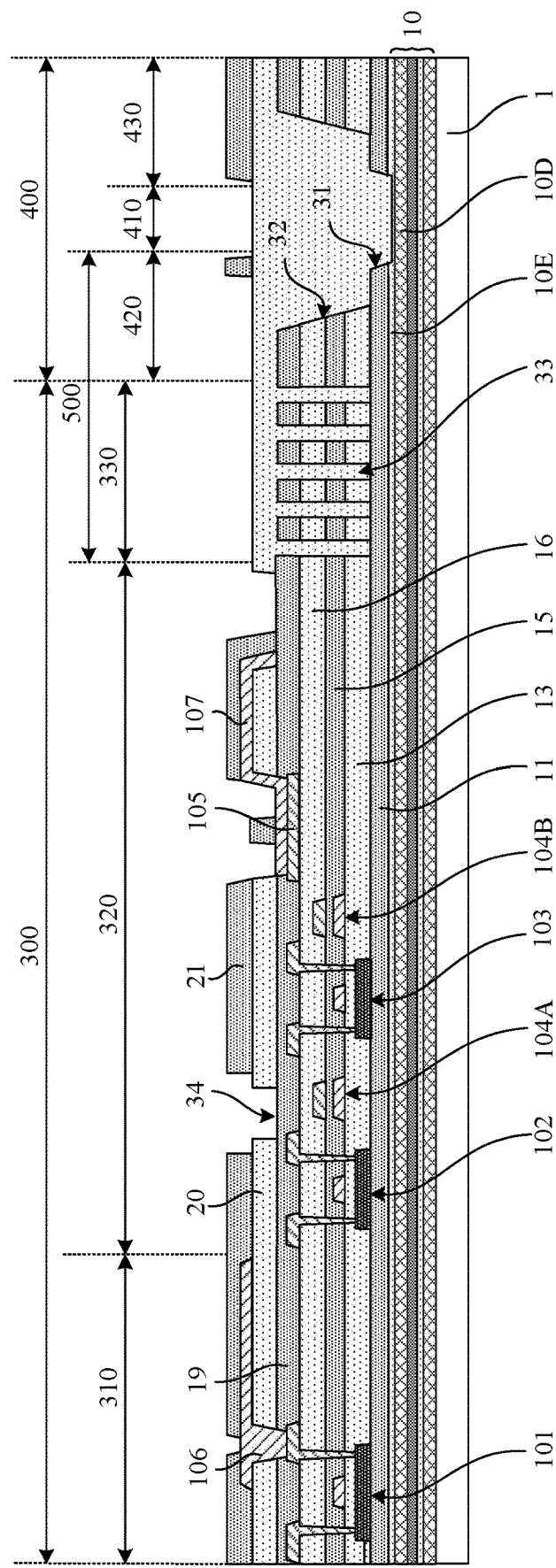
FIG. 9 is a schematic diagram of a structure after a pattern of a second flat layer is formed according to the present disclosure.

(6) A second flat thin film is coated on the flexible base substrate with the above pattern, and a second flat layer 21 pattern is formed on the first flat layer 20 through masking, exposure and development processes. In the display region 310, the second flat layer 21 is provided thereon with a fourth via hole, wherein the second flat layer 21 in the fourth via hole is developed away to expose the surface of the first connection electrode 106; in the peripheral circuit region 320, the second flat layer 21 is provided thereon with a fifth via hole and a gap 34, wherein a portion of the second flat layer 21 close to a side wall of the via hole in the second flat layer 21 is developed to expose a surface of the second connection electrode 107. The gap 34 is arranged between the fourth via holes and the fifth via holes, and the first flat layer 20 and the second flat layer 21 in the gap are developed away to expose a surface of the fifth insulating layer 19. The second flat layer 21 in the region where the crack dam 33 is located and where the partition is located is developed away to expose the first flat layer 20 and the partition. In the cutting region 400, the second flat layer 21 is arranged at part of the inner cutting region 420 and part of the outer cutting region 430, and the second flat layer 21 at other positions is developed away to expose the surface of the first flat layer 20, which is as shown in FIG. 9. In an exemplary embodiment, a thickness of the second planarization layer 21 may be 0.8 μm to 1.5 μm. The position of the second flat layer 21 in the cutting region 400 will be described in detail in the following. In the region where the gap 34 is located, the orthographic projection of the opening of the second flat layer 21 on the flexible base substrate 10 includes the opening of the first flat layer 20, that is the width of the opening of the second flat layer 21 is larger than that of the first flat layer 20, the opening of the first flat layer 20 exposes the fifth insulating layer 19 and the opening of the second flat layer 21 exposes the opening of the first flat layer 20, forming a step on the side wall of the gap 34, so that the cathode formed later also has a stepped shape to ensure a reliable connection between the cathode and the third connection electrode. After this patterning process, the cutting region 400 includes the composite insulating layer which is arranged on the flexible base substrate 10 and has grooves and the first flat layer 20 arranged on the composite insulating layer and filling the grooves. In the present disclosure, the gap 34 formed in the peripheral circuit region 320 is used for discharging gas generated by the film layers in the planarization (PLN) the process, so as to improve the process quality.

Figure 10:
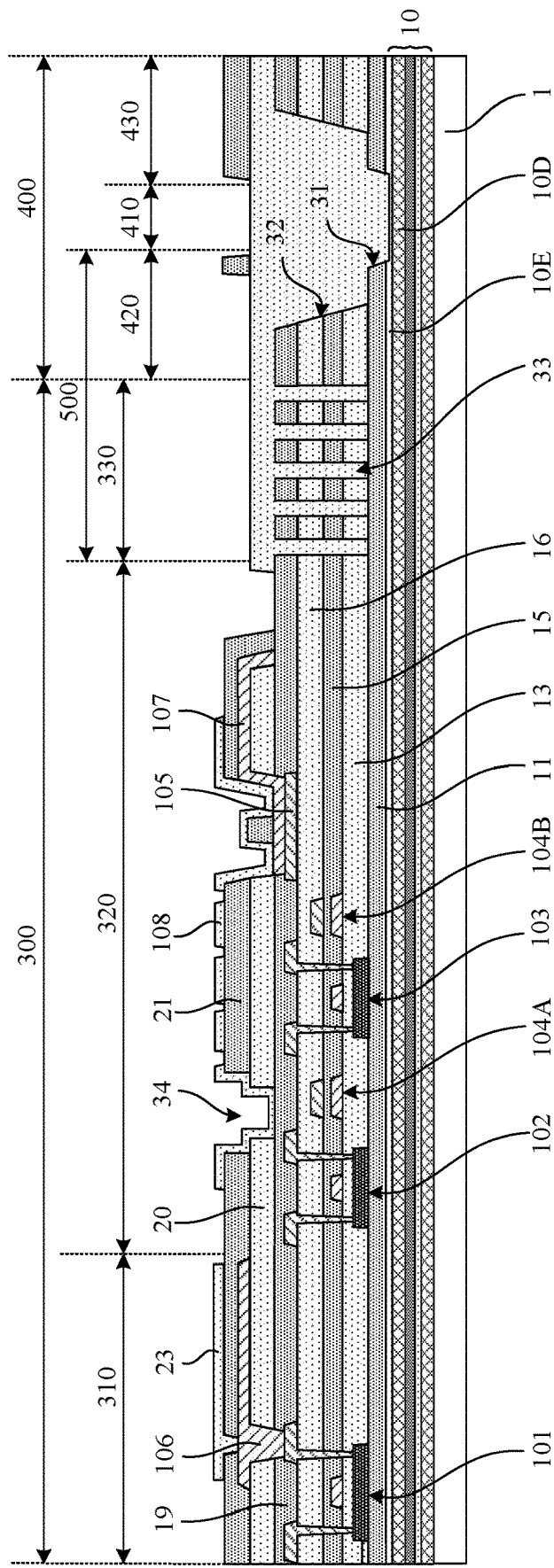
FIG. 10 is a schematic diagram of a structure after patterns of an anode and a third connection electrode are formed according to the present disclosure.

(7) A transparent conductive thin film is deposited on the base substrate with the above pattern, the transparent conductive thin film is patterned through a patterning process to form patterns of an anode 23 and the third connection electrode 108, wherein the anode 23 is formed on the second flat layer 21 of the display region 310 and is connected with the first connection electrode 106 through the fourth via hole, and the third connection electrode 108 is formed on the second flat layer 21 of the peripheral circuit region 320, wherein part of the third connection electrode 108 is connected with the second connection electrode 107 through the fifth via hole, and the other part is arranged in the gap 34. Multiple sixth via holes are formed on the third connection electrode 108 between the fifth via hole and the gap 34, which is as shown in FIG. 10. Since the side wall of the gap 34 has a stepped shape, the third connection electrode 108 arranged in the gap 34 also has a stepped shape. After this patterning process, the film layer structure of the cutting region 400 and the peripheral region 330 (where the crack dam 33 is located) has not changed.

Figure 11:
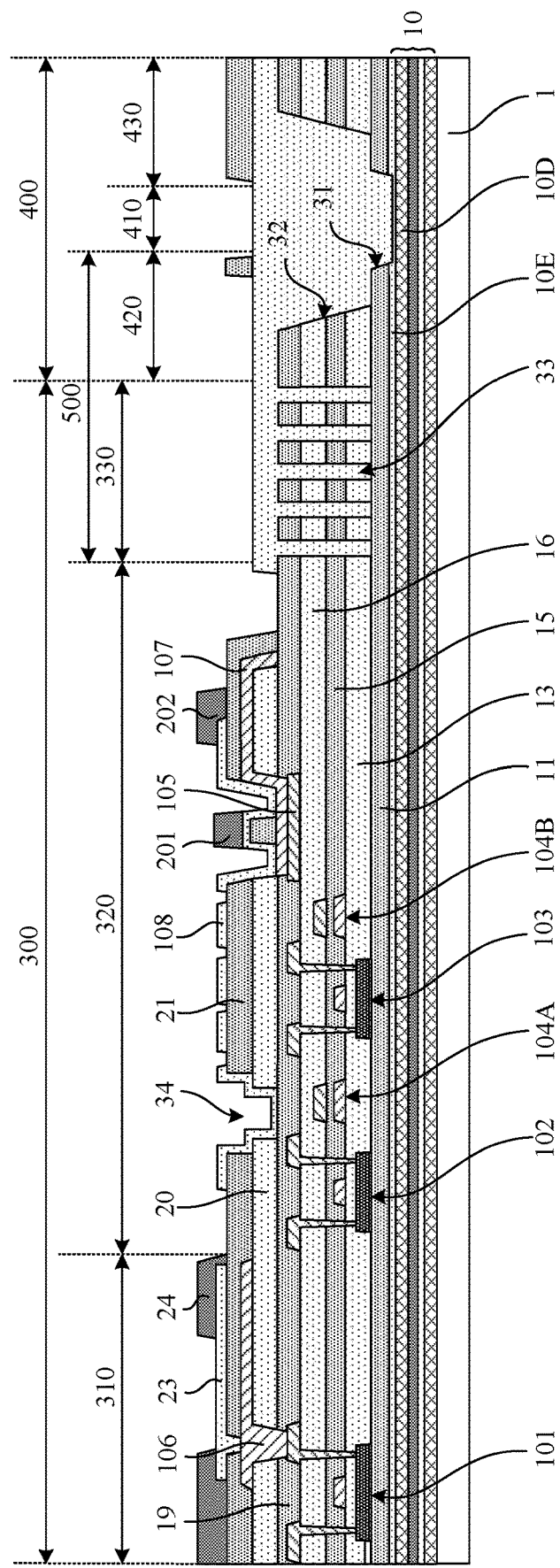
FIG. 11 is a schematic diagram of a structure after patterns of a pixel definition layer and a dam foundation are formed according to the present disclosure.

(8) A pixel definition thin film is coated on the base substrate with the above pattern, and a pixel definition layer (PDL) 24, patterns of a first dam foundation 201 and a second dam foundation 202 are formed in the substrate region 300 through masking, exposure and development processes, wherein the pixel definition layer 24 is formed in the display region 310 and is provided thereon with a pixel opening, and the pixel definition thin film in the pixel opening is developed away to expose a surface of the anode 23. The first dam foundation 201 and the second dam foundation 202 are formed in the peripheral circuit region 320. The first dam foundation 201 is arranged on the third connection electrode 108 in the fifth via hole, and the second dam foundation 202 is arranged on the second flat layer 21 between the fifth via hole and the partition. The cross-sectional shapes of the first dam foundation 201 and the second dam foundation 202 are trapezoidal, which are as shown in FIG. 11. In the present disclosure, the first dam foundation 201 and the second dam foundation 202 are used for forming two supporting dams. After this patterning process, the film layer structure of the cutting region 400 and the peripheral region 330 (where the crack dam 33 is located) has not changed.

Figure 12:
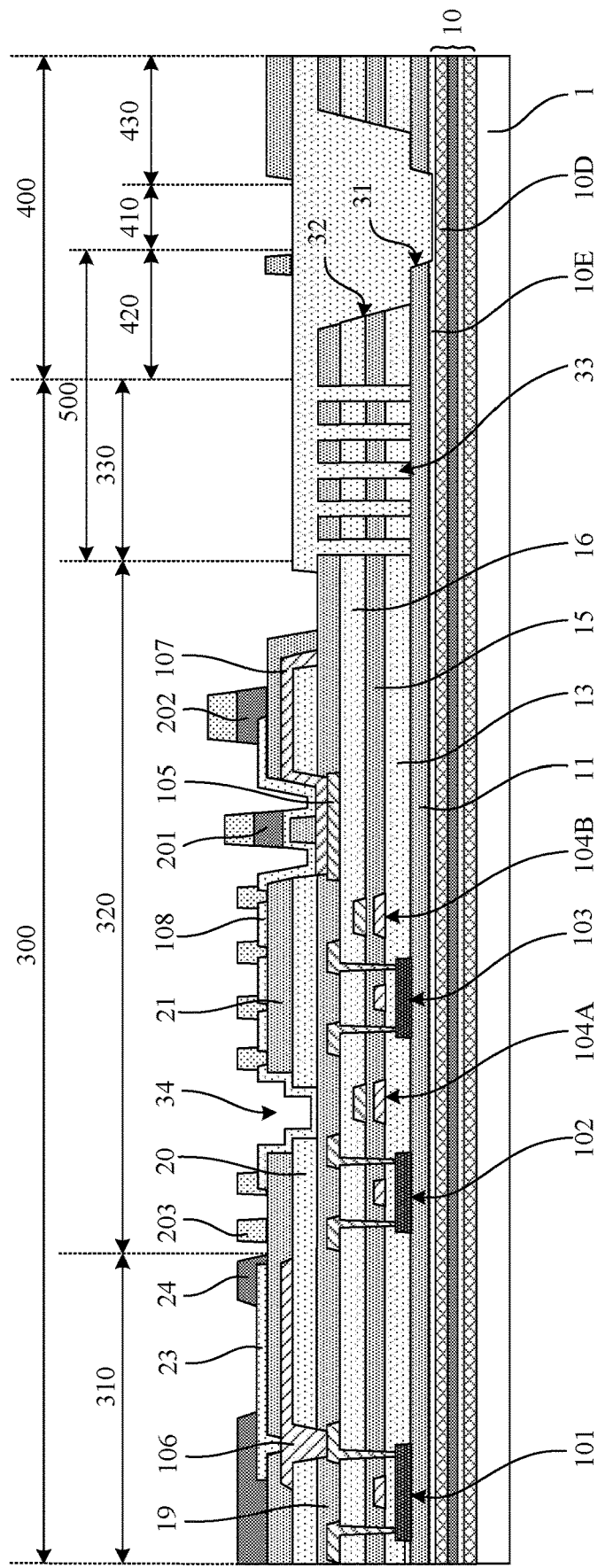
FIG. 12 is a schematic diagram of a structure after a pattern of partition posts is formed according to the present disclosure.

(9) An organic material thin film is coated on the base substrate with the above pattern, and multiple partition posts (PS) 203 patterns are formed in the peripheral circuit region 320 through masking, exposure and development processes, wherein the multiple partition posts 203 are respectively arranged at the positions on two sides of the first dam foundation 201, the second dam foundation 202 and the gap 34, and the cross-sectional shape of each of the multiple partition posts 203 is trapezoidal. The first dam foundation 201 and the partition posts 203 thereon form a first supporting dam, and the second dam foundation 202 and the partition posts 203 thereon form a second supporting dam, which are as shown in FIG. 12. After this patterning process, the film layer structure of the cutting region 400 and the peripheral region 330 (where the crack dam 33 is located) has not changed.

Figure 13:
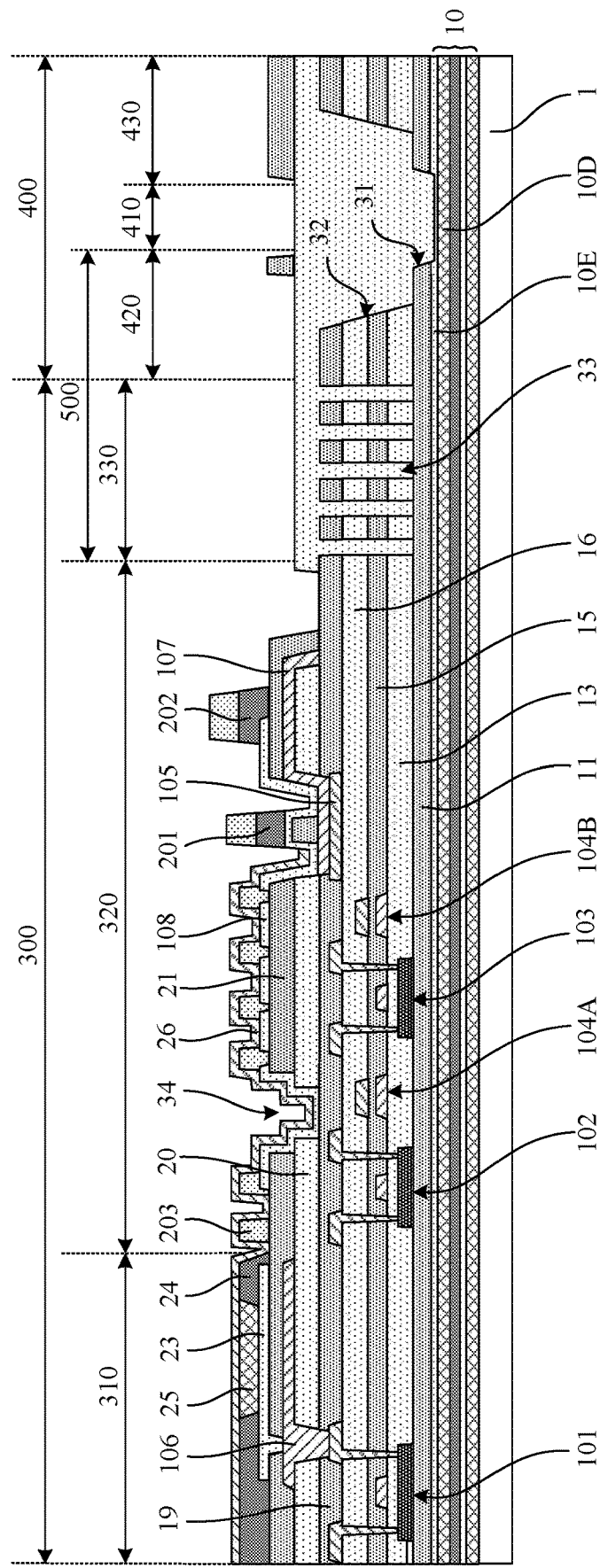
FIG. 13 is a schematic diagram of a structure after patterns of an organic light emitting layer and a cathode are formed according to the present disclosure.

(10) An organic light emitting layer 25 and a cathode 26 are sequentially formed on the base substrate with the above patterns formed, which is as shown in FIG. 13. The organic light-emitting layer 25 includes a hole injection layer, a hole transmission layer, a light emitting layer, an electron transmission layer and an electron injection layer which are stacked, and is formed in the pixel opening of the substrate region 300 to realize the connection between an organic light emitting layer 25 and the anode 23. Since the anode 23 is connected with the first connection electrode 106 and the first connection electrode 106 is connected with the drain electrode of the first transistor 101, light emission control of the organic light emitting layer 25 is achieved. Part of the cathode 26 is formed on the organic light emitting layer 25, the cathode 26 is connected with the organic light emitting layer 25, the other part of the cathode 26 is formed in a region between the pixel opening and the fifth via hole, and the cathode 26 is connected with the third connection electrode 108 through the gap 34 and the fifth via hole. Since the third connection electrode 108 is connected with the second connection electrode 107 and the second connection electrode 107 is connected with the low voltage line 105, the connection between the cathode 26 and the low voltage line 105 is achieved. Since the third connection electrode 108 at the position of the gap 34 has a stepped shape, the formed cathode 26 also has a stepped shape, and contacts with the third connection electrode 108 at different steps, thus ensuring reliable connection between the cathode and the third connection electrode 108. After this patterning process, the film layer structure of the cutting region 400 and the peripheral region 330 (where the crack dam 33 is located) has not changed.

Figure 14:
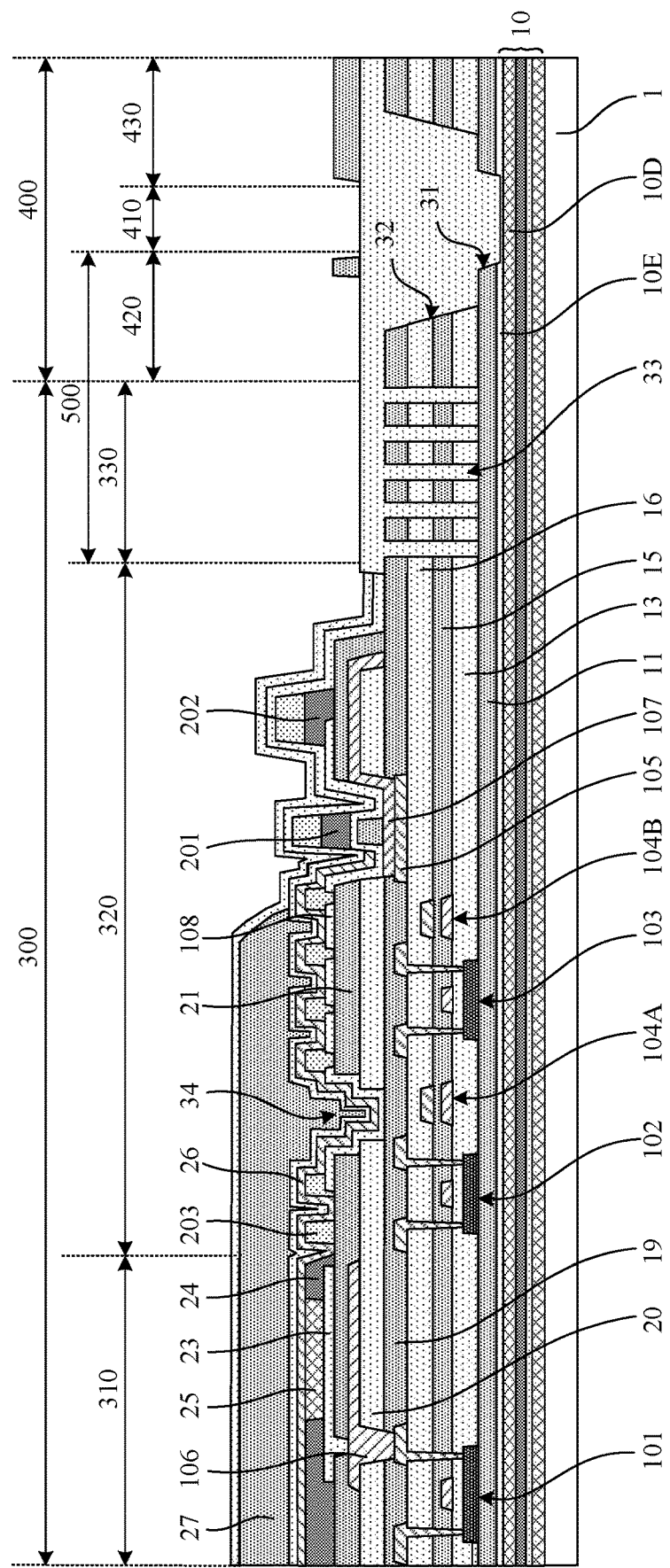
FIG. 14 is a schematic diagram of a structure after a pattern of a packaging layer is formed according to the present disclosure.

(11) The encapsulation layer 27 is formed on the basis of the above pattern, wherein the encapsulation layer 27 is formed in the display region 310 and the peripheral circuit region 320 of the substrate region 300, and adopts a laminated structure of inorganic material/organic material/inorganic material. Two inorganic material layers are arranged in the display region 310 and the peripheral circuit region 320, covering the first support dam and the second support dam, and the organic material layer is arranged between the two inorganic material layers, which is on one side away from the peripheral region 330, which is as shown in FIG. 14. In the present disclosure, since a partition exposing the surface of the fifth insulating layer 19 is formed on the first flat layer 20, two inorganic material layers are directly formed on the fifth insulating layer 19 in the partition, thus ensuring the packaging effect and process quality. After this patterning process, the film layer structure of the cutting region 400 and the peripheral region 330 (where the crack dam 33 is located) has not changed.

Figure 15:
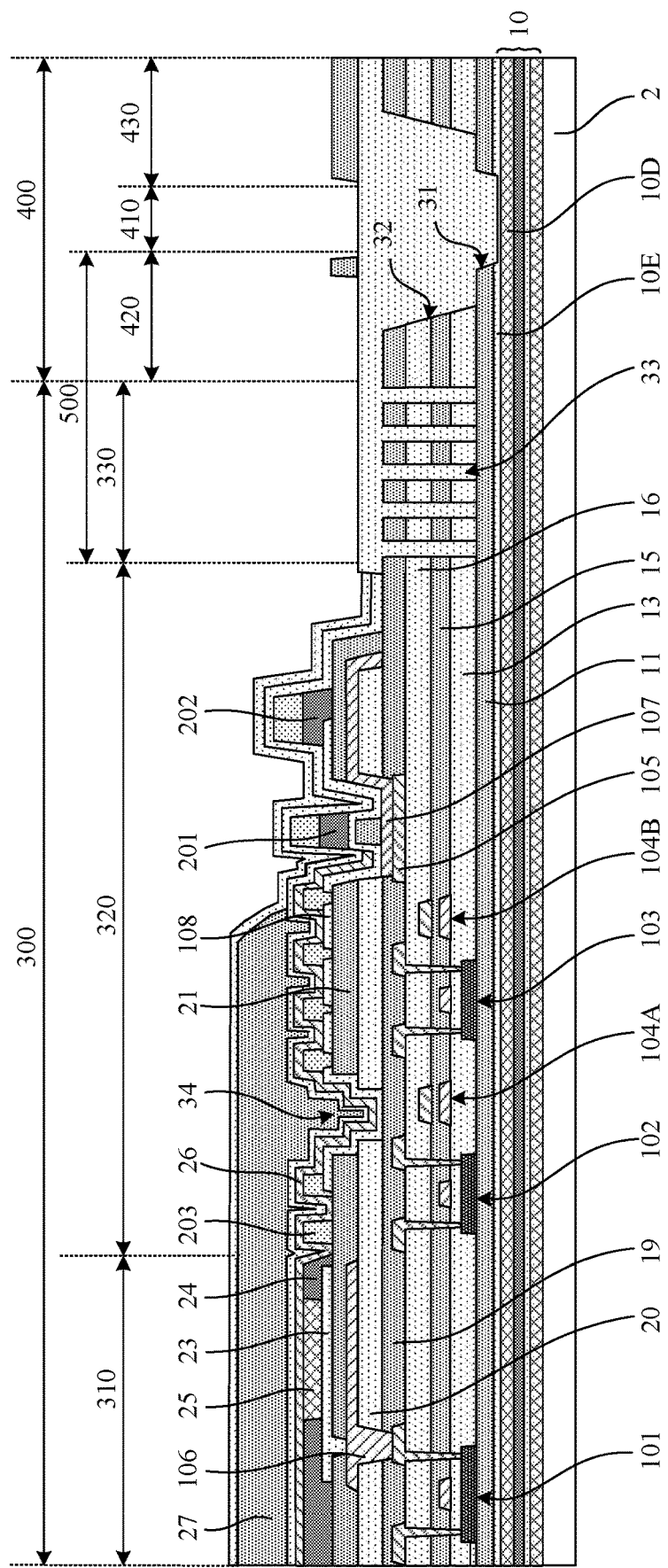
FIG. 15 is a schematic diagram of a structure after a back film is attached according to the present disclosure.

(12) After the above film layer structure is prepared, the display mother plate is peeled off from the glass carrier board 1 by a peeling process, and then a layer of back film 2 is attached to the back of the display mother plate (the side surface of the flexible base substrate 10 away from the film layer) by using roller attaching, thus completing the preparation of the display mother plate, which is as shown in FIG. 15.

Figure 16:
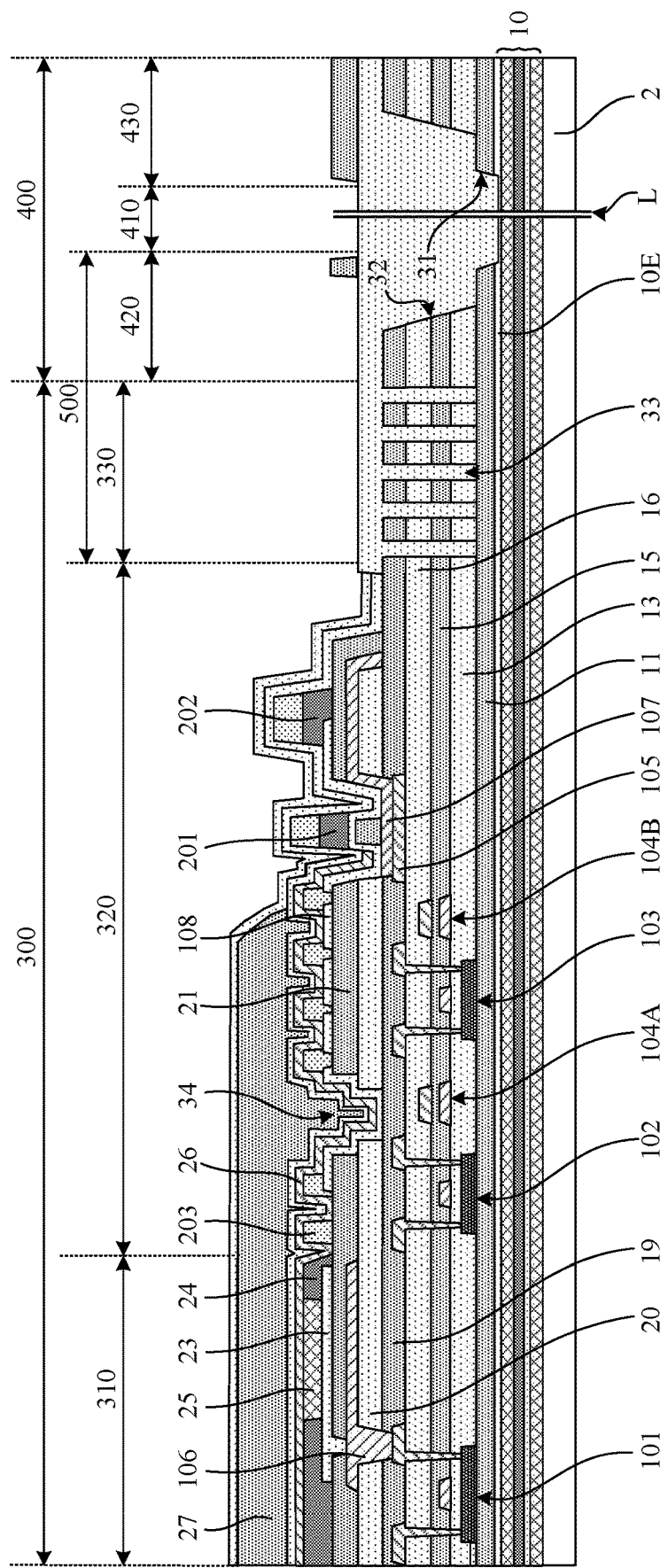
FIG. 16 is a schematic diagram of cutting according to the present disclosure.

(13) The cutting equipment cuts along the cutting lane region 410 of the cutting region 400, and a cutting strip L separates the display mother plate into the display substrate according to the present disclosure, which is as shown in FIG. 16. After the cutting is completed, the cutting track region 410 and the outer cutting region 430 of the cutting region 400 are cut away, while the inner cutting region 420 remains. The peripheral region 330 of the substrate region 300 and the inner cutting region 420 of the cutting region 400 constitute the edge region 500 of the display substrate of the present disclosure, which is as shown in FIG. 3.

With reference to FIG. 3 to FIG. 16, the edge region 500 of the display substrate of the present disclosure includes the flexible base substrate 10 and the composite insulating layer disposed on the flexible base substrate 10. The composite insulating layer is composed of multiple inorganic insulating layers including the first insulating layer 11, the second insulating layer 13, the third insulating layer 15, the fourth insulating layer 16 and the fifth insulating layer 19 which are stacked on the flexible base substrate 10. In the inner cutting region 420 in the edge region 500, the flexible base substrate 10 and the composite insulating layer form a step structure, wherein the step structure includes the first step 51 formed by the first flexible layer 10A, the first barrier layer 10B, the amorphous silicon layer 10C, the second flexible layer 10D and the first sublayer of the second barrier layer 10E, and the second step 52 formed by the second sublayer of the second barrier layer 10E and the first insulating layer 11, and the third step 53 formed by the second insulating layer 13, the third insulating layer 15, the fourth insulating layer 16, and the fifth insulating layer 19. The heights of the first step 51, the second step 52, and the third step 53 sequentially increase in the direction from the inner cutting region 420 to the peripheral region 330, that is, from the first step 51 to the third step 53. The inner cutting region 420 further includes the first flat layer 20 and the second flat layer 21 disposed on the first flat layer 20, wherein the first flat layer 20 covers the above step structure, the outer edge (an end face away from the peripheral region 330) of the first flat layer 20 is substantially flush with the outer edge of the flexible base substrate 10, and the second flat layer 21 is disposed at an interface region between the first step 51 and the second step 52. In the peripheral region 330 of the edge region 500, the crack dam 33 and the first flat layer 20 covering the crack dam 33 are formed on the composite insulating layer, wherein the crack dam 33 includes multiple cracks arranged at intervals in the composite insulating layer, and the second insulating layer 13, the third insulating layer 15, the fourth insulating layer 16 and the fifth insulating layer 19 in the cracks are removed to expose the surface of the first insulating layer 11. The first flat layer 20 of the peripheral region 330 covers the crack dam 33 and fills the multiple cracks arranged at intervals in the crack dam 33. A surface of the first flat layer 20 of the peripheral region 330 is substantially flush with a surface of the first flat layer 20 of the inner cutting region 420.

Figure 17:
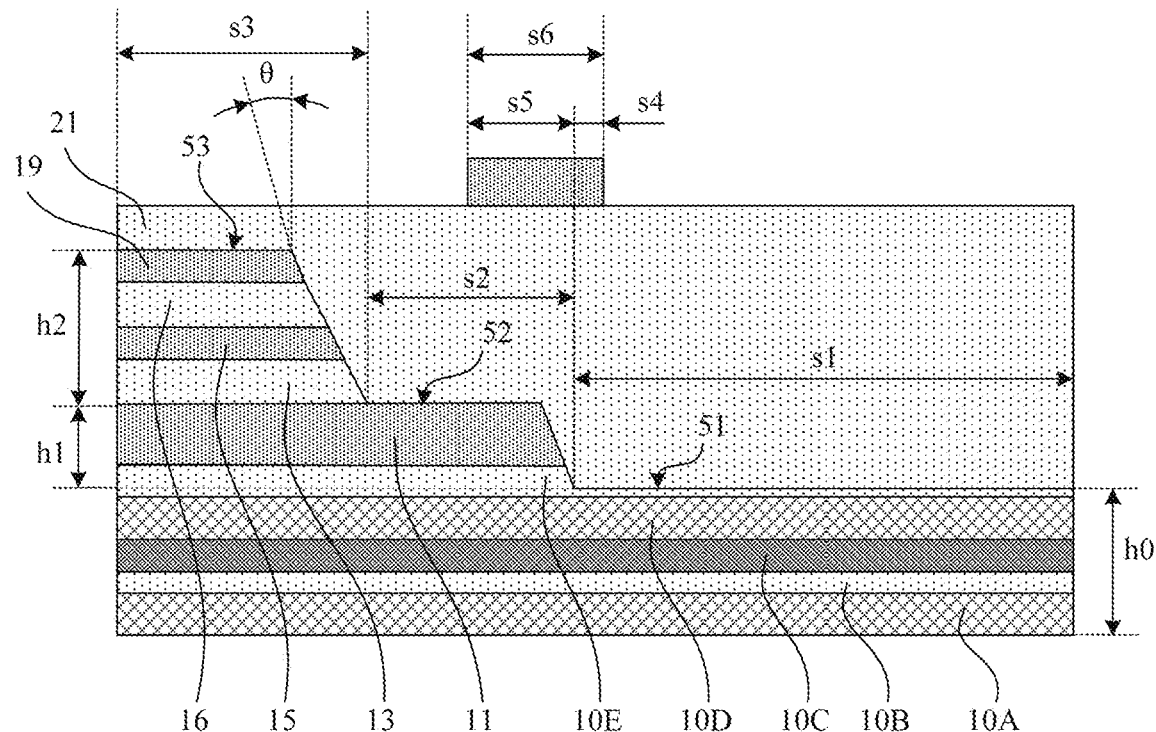
FIG. 17 is a schematic diagram of a structure of an edge region of a display substrate according to the present disclosure.

FIG. 17 is a schematic diagram of a structure of an edge region of a display substrate according to the present disclosure. As shown in FIG. 17, in the step structure of the edge region of the present disclosure, the side walls of the second step 52 and the third step 53 are slopes, and the included angle θ between the generatrix of the slopes and the normal direction of the display substrate is 20 to 50 degrees.

In an exemplary embodiment, the thickness h0 of the first step 51 is greater than the thickness h2 of the third step 53, and the thickness h0 of the first step 51 is greater than the thickness h1 of the second step 52. In some possible implementations, the thickness h2 of the third step 53 may be greater than the thickness h1 of the second step 52. In the present disclosure, the thickness of each step refers to the distance between the upper surface of the step and the lower surface of the step.

In an exemplary embodiment, the thickness h0 of the first step 51 may be 15 μm to 20.7 μm, the thickness h1 of the second step 52 may be 0.2 μm to 1.3 μm, and the thickness h2 of the third step 53 may be 0.5 μm to 1.4 μm. In some possible implementations, the thickness h0 of the first step 51 may be 17.654 μm, the thickness h1 of the second step 52 may be 0.76 μm, and the thickness h2 of the third step 53 may be 0.80 μm.

In an exemplary embodiment, the thickness of the first sublayer may be 0.05 μm to 0.06 μm, and the thickness of the second sublayer may be 0.44 μm to 0.55 μm, that is, in the second barrier layer 10E with a thickness of 0.4 μm to 0.7 μm, the etched thickness may be 0.44 μm to 0.55 μm, and the remaining thickness may be 0.05 μm to 0.06 μm. In some possible implementations, the thickness of the second barrier layer 10E may be 0.55 μm, the thickness of the first sublayer may be 0.054 μm, and the thickness of the second sublayer may be 0.496 μm.

In an exemplary embodiment, taking a surface of a side of the first sublayer adjacent to the second flexible layer (a surface of a side of the second barrier layer adjacent to the second flexible layer, or a surface of a side of the flexible layer adjacent to the second barrier layer) as a reference surface, the distance between the upper surface of the first step 51 and the reference surface may be 0.05 μm to 0.06 μm, the distance between the upper surface of the second step 52 and the reference surface may be 0.75 μm to 0.95 μm, and the distance between the upper surface of the third step 53 and the reference surface may be 1.40 μm to 1.80 μm. In some possible implementations, the distance between the upper surface of the first step 51 and the reference surface may be 0.054 μm, the distance between the upper surface of the second step 52 and the reference surface may be 0.812 μm, and the distance between the upper surface of the third step 53 and the reference surface may be 1.614 μm.

In an exemplary embodiment, the distance from an edge of the first step 51 to an edge of the second step 52 is s1, and s1 is called the width of the first step 51. The distance from the edge of the second step 52 to an edge of the third step 53 is s2, and s2 is called the width of the second step 52. The distance from the edge of the third step 53 to an edge of the crack dam is s3, and s3 is called the width of the third step 53. The width s1 of the first step 51 is greater than the width s2 of the second step 52, and the width s1 of the first step 51 is greater than the width s3 of the third step 53.

In an exemplary embodiment, the width s1 of the first step 51 may be 55 μm to 210 μm, the width s2 of the second step 52 may be 5 μm to 40 μm, the width s3 of the third step 53 may be 5 μm to 15 μm, and the width s2 of the second step 52 may be greater than or equal to the width s3 of the third step 53. In some possible implementations, the width s1 of the first step 51 may be 105 μm. In other possible implementations, the width s1 of the first step 51 may be 160 μm. In some possible implementations, the width s2 of the second step 52 may be 35 μm, and the width s3 of the third step 53 may be 6 μm. In some possible implementations, the width s2 of the second step 52 may be 10 μm, and the width s3 of the third step 53 may be 10 μm.

In an exemplary embodiment, an orthographic projection of the second flat layer 21 of the edge region 500 on the flexible base substrate 10 partially overlaps with orthographic projections of the first step 51 and the second step 52 on the flexible base substrate 10, that is, the orthographic projection of the second flat layer 21 on the flexible base substrate 10 overlaps with part of the orthographic projection of the second step 52 on the flexible base substrate 10, and overlaps with part of the orthographic projection of the first step 51 on the flexible base substrate 10. A distance from the edge of the second flat layer 21 of the edge region 500 away from the edge of the display region to the edge of the second step 52 is s4, s4 is referred to as the width of the second flat layer 21 covering the first step 51, that is, the width of overlapping between the orthographic projection of the second flat layer 21 on the flexible base substrate 10 and the orthographic projection of the first step 51 on the flexible base substrate 10. A distance from the edge of the second flat layer 21 of the edge region 500 adjacent to the edge of the display region to the edge of the second step 52 is s5, s5 is referred to as the width of the second flat layer 21 covering the second step 52, that is, the width of overlapping between the orthographic projection of the second flat layer 21 on the flexible base substrate 10 and the orthographic projection of the second step 52 on the flexible base substrate 10. In an exemplary embodiment, the width s4 of the second flat layer 21 covering the first step 51 may be 10 μm to 20 μm, and the width s5 of the second flat layer 21 covering the second step 52 may be 20 μm to 30 μm. In some possible implementations, the width s4 of the second flat layer 21 covering the first step 51 may be 15 μm, and the width s5 of the second flat layer 21 covering the second step 52 may be 25 μm. In an exemplary embodiment, a width s6 of the second flat layer 21 of the edge region 500 in a direction away from the display region may be 30 μm to 50 μm. In some possible implementations, the width s6 of the second flat layer 21 of the edge region 500 may be 40 μm. In an exemplary embodiment of the present disclosure, the second flat layer 21 is arranged at an interface region between the first step 51 and the second step 52, and a region where side walls of the slopes of the second step 52 is located is covered by the second flat layer 21, such that the etching residue of the transparent conductive thin film can be avoided in the subsequent patterning process for forming the pattern of the anode 23 and the third connection electrode 108, and the process quality can be improved.

In an exemplary embodiment, the substrate region may further include a touch layer or touch panel disposed on the packaging layer and a protective layer (OC) covering the touch layer or the touch panel. In another exemplary embodiment, the display substrate region may further include a Temporary Protect Film (abbreviated as TPF), which is attached to the packaging layer, and is used for protecting the film layer structure of the display substrate. The operation of attaching the back film is performed after the protective film is attached. After cutting, the protective film is removed first, and then the touch layer and a cover plate are sequentially arranged on the packaging layer to form a touch display panel; or the cover plate is directly arranged on the packaging layer to form a display panel.

In the present disclosure, the first insulating film, the second insulating film, the third insulating film, the fourth insulating film and the fifth insulating film may be adopt any one or more of silicon oxide (SiOx), silicon nitride (SiNx) and silicon oxynitride (SiON), and may be a single layer, multiple layers or a composite layer. The first insulating layer is called a Buffer layer to improve the water and oxygen resistance capability of the base substrate, the second insulating layer and third insulating layer are called gate insulating (GI) layers, the fourth insulating layer is called an interlayer insulating (ILD) layer, and the fifth insulating layer is called a passivation (PVX) layer. Organic materials may be used as the first flat layer and the second flat layer. The first metal thin film, the second metal thin film, the third metal thin film and the fourth metal thin film may adopt metal materials, such as any one or more of silver (Ag), copper (Cu), aluminum (Al) and molybdenum (Mo), or alloy materials of the above metals, such as AlNd alloy or MoNb alloy, which can have a single-layer structure or a multilayer composite structure, such as Mo/Cu/Mo. The cathode may adopt any one or more of magnesium (Mg), silver (Ag), aluminum (Al), copper (Cu) and lithium (Li), or an alloy made of any one or more of the above metals. The active layer thin film may use various materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, or the like, that is, the present disclosure is applicable to transistors manufactured based on an Oxide technology, a silicon technology and an organic technology. The transparent conductive thin film may adopt indium tin oxide (ITO) or indium zinc oxide (IZO), and the pixel definition layer may adopt polyimide, acrylic or polyethylene terephthalate, etc.

As shown in FIG. 3 to FIG. 16, a display substrate provided by the present disclosure includes:
  a flexible base substrate 10, wherein the flexible base substrate 10 includes a first flexible layer 10A, a first barrier layer 10B, an amorphous silicon (a-si) layer 10C, a second flexible layer 10D and a second barrier layer 10E which are sequentially stacked;
  a first insulating layer 11 disposed on the flexible base substrate 10;
  an active layer pattern disposed on the first insulating layer 11, wherein the active layer pattern is disposed in a display region 310, the active layer pattern includes at least a first active layer 12A, a second active layer 12B and a third active layer 12C;
  a second insulating layer 13 covering the active layer;
  a first metal gate layer disposed on the second insulating layer 13, wherein the first metal gate layer is disposed in the display region 310 and the peripheral circuit region 320, the first metal gate layer includes at least a first gate electrode 14A of the display region 310 and a second gate electrode 14B, a third gate electrode 14C, a first capacitor electrode 41A and a second capacitor electrode 41B of the peripheral circuit region 320;
  a third insulating layer 15 covering the first metal gate layer;
  a second metal gate layer disposed on the third insulating layer 15, wherein the second metal gate layer is disposed in the peripheral circuit region 320, and includes at least a third capacitor electrode 42A and a fourth capacitor electrode 42B;
  a fourth insulating layer 16 covering the second metal gate layer, wherein the fourth insulating layer 16 of the display region 310 and the peripheral circuit region 320 are provided with multiple first via holes, which expose the first active layer 12A, the second active layer 12B and the third active layer 12C respectively;
  a source-drain metal layer disposed on the fourth insulating layer 16, wherein the source-drain metal layer is disposed in the display region 310 and the peripheral circuit region 320, the source-drain metal layer includes at least a first source electrode 17A and a first drain electrode 18A of the display region 310, and a second source electrode 17B, a second drain electrode 18B, a third source electrode 17C, a third drain electrode 18C and a low voltage line 105 of the peripheral circuit region 320, the first source electrode 17A and the first drain electrode 18A are respectively connected with the first active layer 12A through the first via holes, the second source electrode 17B and the second drain electrode 18B are respectively connected with the second active layer 12B through the first via holes, and the third source electrode 17C and the third drain electrode 18C are respectively connected with the third active layer 12C through the first via holes;

a fifth insulating layer 19 covering the source-drain metal layer, wherein the fifth insulating layer 19 is arranged in the display region 310 and part of the peripheral circuit region 320; the composite insulating layer formed in the peripheral region 330 is provided with a crack dam 33, the crack dam 33 includes multiple cracks arranged at intervals, and the cracks expose the first insulating layer 11; the composite insulating layer formed by the cutting region 400 is provided with grooves which expose a first sublayer of the second barrier layer 10E of the flexible base substrate 10; the grooves include a first groove 31 and a second groove 32, the first groove 31 is disposed at the second sublayer of the second barrier layer 10E and the first insulating layer 11 and exposes the first sublayer of the second barrier layer 10E of the flexible base substrate, and the second groove 32 is disposed on the second insulating layer 13, the third insulating layer 15, the fourth insulating layer 16 and the fifth insulating layer 19 and exposes the first groove 31;

a first flat layer 20 covering the above structure; in the display region 310, the first flat layer 20 is provided thereon with a second via hole, and in the peripheral circuit region 320, the first flat layer 20 is provided thereon with a third via hole and a partition, wherein the second via hole exposes the first drain electrode 18A, the third via hole exposes the low voltage line 105, and the partition exposes the fifth insulating layer 19; in the peripheral region 330, the first flat layer 20 completely fills the crack dam 33, and in the cutting region 400, the first flat layer 20 completely fills the grooves;

a metal conductive layer disposed on the first flat layer 20, wherein the metal conductive layer includes at least a first connection electrode 106 of the display region 310 and a second connection electrode 107 of the peripheral circuit region 320, the first connection electrode 106 is connected with the first drain electrode 18A through the second via hole, and the second connection electrode 107 is connected with the low voltage line 105 through the third via hole;

a second flat layer 21 covering the metal conductive layer; in the display region 310, the second flat layer 21 is provided with a fourth via hole; in the peripheral circuit region 320, the second flat layer 21 is provided with a fifth via hole and a gap 34, wherein the fourth via hole exposes the first connection electrode 106, the fifth via hole exposes the second connection electrode 107, and the gap 34 exposes the fifth insulating layer 19;

an anode 23 and a third connection electrode 108 formed on the second flat layer 23, wherein the anode 23 is formed in the display region 310, the third connection electrode 108 is formed in the peripheral circuit region 320, the anode 23 is connected with the first connection electrode 106 through the fourth via hole, and the third connection electrode 108 is connected with the second connection electrode 107 through the fifth via hole;

a first dam foundation 201 and a second dam foundation 202 arranged in the pixel definition layer 24 of the display region 310 and the peripheral circuit region 320, wherein the pixel definition layer 24 is provided thereon with a pixel opening exposing the anode 23, the first dam foundation 201 is arranged on the third connection electrode 108 in the fifth via hole, and the second dam foundation 202 is arranged on one side of the first dam foundation 201 adjacent to the cutting region 400;

multiple partition posts 203 disposed in the peripheral circuit region 320;

an organic light emitting layer 25 disposed in the display region 310, wherein the organic light emitting layer 25 is connected with the anode 23;

a cathode 26 disposed in the display region 310 and the peripheral circuit region 320, wherein the cathode 26 is connected with the organic light emitting layer 25 and the third connection electrode 108 respectively; and a packaging layer 27 disposed in the display region 310 and the peripheral circuit region 320.

Figure 18:
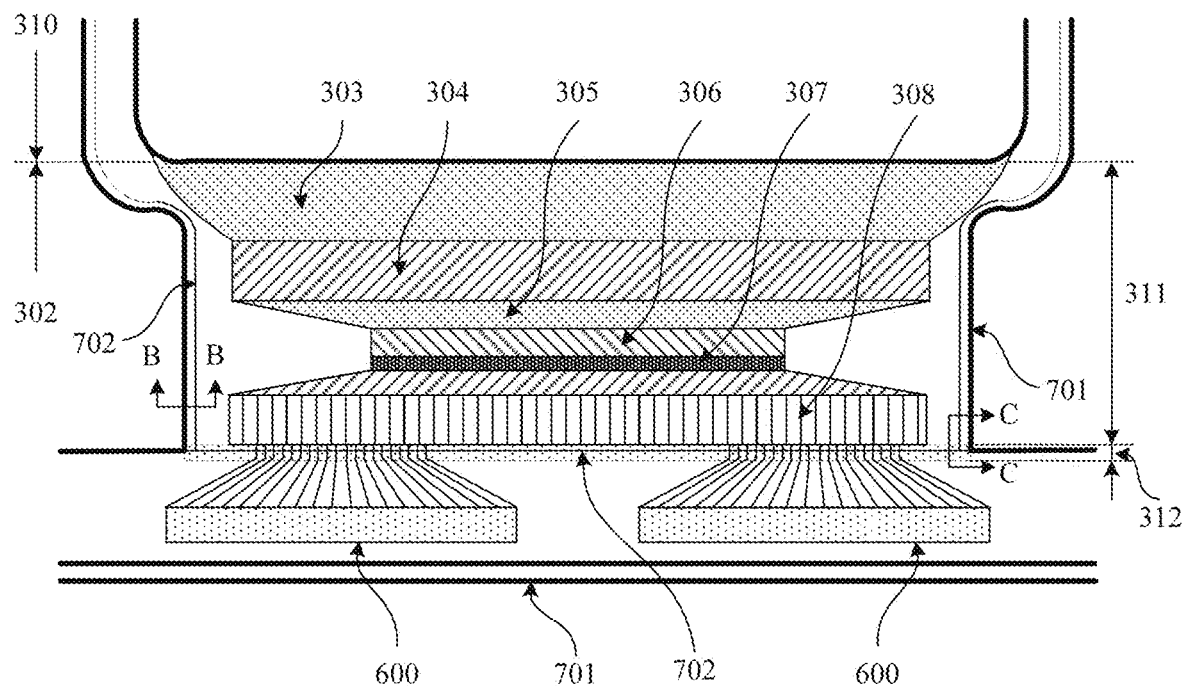
FIG. 18 is a schematic diagram of a binding region according to the present disclosure.

FIG. 18 is a schematic diagram of a binding region according to the present disclosure. As shown in FIG. 18, in a plane parallel to a display substrate, a binding region 302 is located on one side of a display region 310, and includes a first fan-out region 303, a bending region 304, a second fan-out region 305, an antistatic region 306, a driving chip region 307 and a binding pin region 308. The composite insulating layer of the bending region 304 is removed by EBA MASK and EBB MASK processes to reduce the thickness of the bending region. In the present disclosure, the aforementioned process of forming the first groove and the second groove is performed in synchronization with the process of removing the composite insulating layer in the bending region 304. In the process of preparing the display mother plate, an array test unit 600 is further arranged on one side of the binding region 302 away from the display region 310. The array test unit 600 is connected with the binding pin region 308 through a signal line and is configured to test the display substrate to check whether there is short circuit, open circuit and other problems. A first cutting line 701 and a second cutting line 702 are arranged outside the binding region 302. The second cutting line 702 is a fine cutting line and is located at the periphery of the binding region 302, and the shape of the second cutting line 702 is the same as the profile of the binding region 302. The first cutting line 701 is a rough cutting line and is located at the periphery of the second cutting line 702. The shape of the first cutting line 701 is the same as the shape of the second cutting line 702, but only the second cutting line 702 is arranged between the binding region 302 and the array test unit 600. At least one first cutting line 701 is further provided on one side of the array test unit 600 away from the binding region 302. After the film layer process of the display mother plate is completed, the cutting equipment cuts the display mother plate along the first cutting line 701 (rough cutting line) to form multiple substrate regions, and after a display substrate test is completed, the cutting equipment cuts the substrate regions along the second cutting line 702 (fine cutting line) to form a display substrate.

Figure 19:
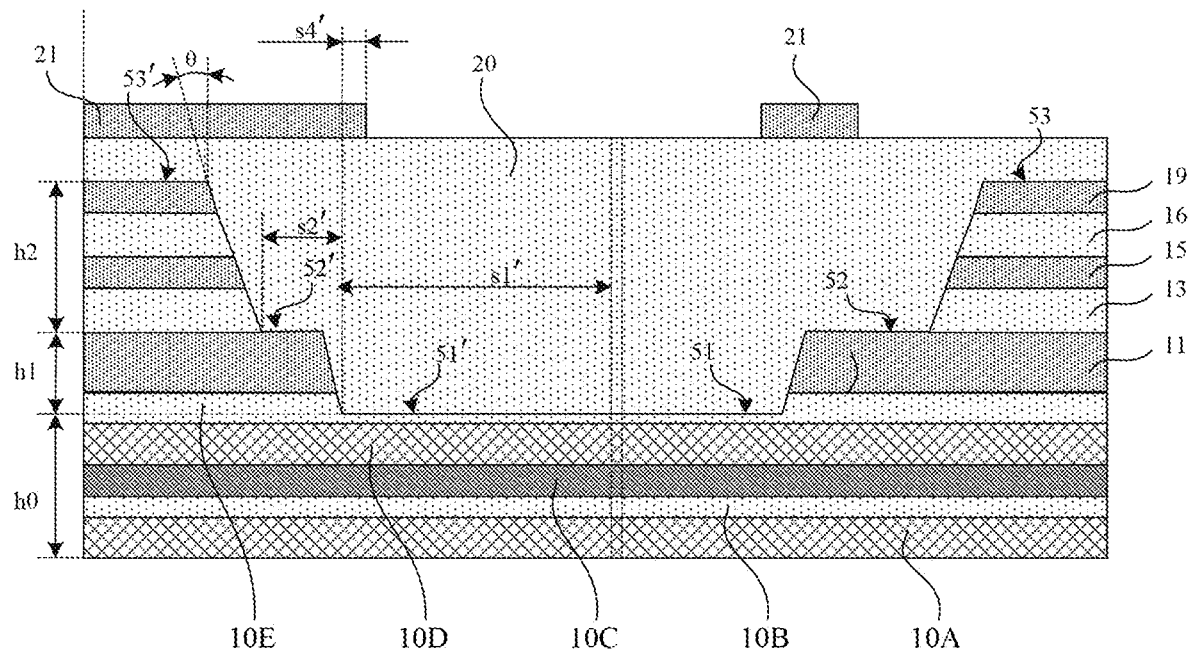
FIG. 19 is a sectional view taken along B-B in FIG. 18.

FIG. 19 is a sectional view taken along B-B in FIG. 18. In a plane perpendicular to the display substrate, the binding region 302 includes a first insulating layer 11 disposed on the flexible base substrate 10, a second insulating layer 13 disposed on the first insulating layer 11, a third insulating layer 15 disposed on the second insulating layer 13, a fourth insulating layer 16 disposed on the third insulating layer 15, multiple first leads disposed on the fourth insulating layer 16, a fifth insulating layer 19 covering the multiple first leads, a first flat layer 20, multiple second leads (not shown) disposed on the first flat layer 20, and a second flat layer 21 covering the multiple second leads. The multiple first leads are arranged on the same layer as the aforementioned source-drain metal layer and they are formed at the same time by the same patterning process, and the multiple second leads are arranged on the same layer as the metal conductive layer and they are formed at the same time by the same patterning process. In some possible implementations, the binding region 302 may further include leads arranged in the same layer as the aforementioned first metal gate layer, or may include leads arranged in the same layer as the aforementioned second metal gate layer. The cutting region outside the binding region includes a composite insulating layer and the first flat layer 20 which are arranged on the flexible base substrate 10, wherein the composite insulating layer is provided with a groove of a step structure, and the first flat layer 20 fills the groove.

FIG. 19 illustrates a structure of the groove. The right side of the groove is a step structure of the edge region, and the left side of the groove is a step structure of the outer cutting region 430, which is called a Dummy region. The double dashed line in the middle part of the groove represents the cutting line. The features of the step structure in the edge region and its corresponding geometric parameters have been described in detail in FIG. 17, which will not be repeated here. As shown in FIG. 19, in the step structure of dummy region, side walls of the second step 52' and the third step 53' of the dummy region are slopes, and an included angle θ between the generatrix of the slopes and the normal direction of the display substrate is 20 to 50 degrees.

In an exemplary embodiment, a thickness h0 of the first step 51' of the dummy region is greater than a thickness h2 of the third step 53' of the dummy region, and the thickness h0 of the first step 51' of the dummy region is greater than a thickness h1 of the second step 52' of the dummy region. In some possible implementations, the thickness h2 of the third step 53' of the dummy region may be greater than the thickness h1 of the second step 52' of the dummy region.

In an exemplary embodiment, the thickness h0 of the first step 51' of the dummy region may be 15 μm to 20.7 μm, the thickness h1 of the second step 52' of the dummy region may be 0.2 μm to 1.2 μm, and the thickness h2 of the third step 53' may be 0.5 μm to 1.4 μm. In some possible implementations, the thickness h0 of the first step 51' of the dummy region may be 17.654 μm, the thickness h1 of the second step 52' of the dummy region may be 0.76 μm, and the thickness h2 of the third step 53' of the dummy region may be 0.80 μm.

In an exemplary embodiment, a distance from the edge of the first step 51' of the dummy region to the edge of the second step 52' of the dummy region is s1', and s1' is called the width of the first step 51' of the dummy region. A distance from the edge of the second step 52' of the dummy region to the edge of the third step 53' of the dummy region is s2', and s2' is called the width of the second step 52' of the dummy region. The width s1' of the first step 51' of the dummy region is greater than the width s2' of the second step 52' of the dummy region.

In an exemplary embodiment, the width s1' of the first step 51' of the dummy region is 55 μm to 155 μm, and the width s2' of the second step 52' of the dummy region is 5 μm to 15 μm. In some possible implementations, the width s1' of the first step 51' of the dummy region is 105 μm. In some possible implementations, the width s2' of the second step 52' of the dummy region is 10 μm.

In an exemplary embodiment, an orthographic projection of the second flat layer 21 of the dummy region on the flexible base substrate 10 includes orthographic projections of the second step 52' and the third step 53' of the dummy region on the flexible base substrate 10, and includes an orthographic projection of part of the first step 51' of the dummy region on the flexible base substrate 10. The distance from the edge of the second flat layer 21 of the dummy region adjacent to the display region to the edge of the second step 52' of the dummy region is s4', and s4' is called the width of the first step 51' of the dummy region covered by the second flat layer 21. In an exemplary embodiment, the width s4' of the second flat layer 21 covering the first step 51' of the dummy region is 10 μm to 20 μm. In some possible implementations, the width s4' of the second flat layer 21 covering the first step 51' of the dummy region is 15 μm.

Figure 20:
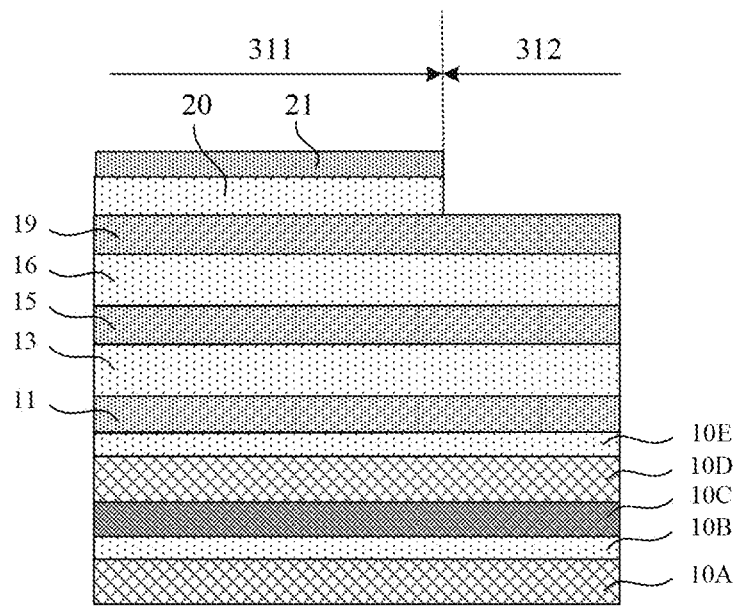
FIG. 20 is a sectional view taken along C-C in FIG. 18.

FIG. 20 is a sectional view taken along C-C in FIG. 18. As shown in FIG. 18 and FIG. 20, along the direction away from the display region 310, the binding region 302 includes a binding circuit region 311 and a binding cutting region 312, the first fan-out region 303, the bending region 304, the second fan-out region 305, the antistatic region 306, the driving chip region 307 and the binding pin region 308 are arranged in the binding circuit region 311. The second cutting line 702 between the binding region 302 and the array test unit 600 is arranged in the binding cutting region 312. When forming the first flat layer 20 and the second flat layer 21, the first flat layer 20 and the second flat layer 21 in the region where the binding cutting region 312 and the array test unit 600 are located are removed, that is, along the direction away from the display region 310, the first flat layer 20 and the second flat layer 21 extend to the boundary between the binding circuit region 311 and the binding cutting region 312. Since multiple signal lines are arranged between the binding region 302 and the array test unit 600, the composite insulating layer of the binding cutting region 312 is not provided with the first groove and the second groove. After the display substrate test is finished, the cutting equipment cuts the substrate region along the second cutting line 702, and the edge region of the binding region 302 away from the display region forms a stair structure, which includes a first stair and a second stair. The first stair consists of a flexible base substrate and a composite insulating layer, end faces of the flexible base substrate and the composite insulating layer at the side away from the display region are flush with each other, while the second stair consists of a first flat layer and a second flat layer, and end faces of the first flat layer and the second flat layer at the side away from the display region are substantially flush with each other. In this way, the stair structure is formed in the edge region of the binding region 302 at the side away from the display region 310, and except for the edge region of the binding region 302 at the side away from the display region 310, the step structure is formed in all other edge regions of the binding region and the display region.

It can be seen from the structure and preparation process of the display substrate according to the present disclosure that in the display substrate provided by the present disclosure, the grooves of the cutting region are completely filled by providing the first flat layer, which avoids metal block residue in the patterning process of the metal conductive layer, and neither Ag particles or granules will appear in the subsequent process, nor the case that Ag particles or granules being attached everywhere will take place, thus effectively avoiding the occurrence of the defect of dark spots on the display substrate and improving the display quality.

In a structure of a display substrate, in order to reduce the cutting thickness and difficulty of a subsequent cutting process, the composite insulating layer and the first flat layer in a cutting region are provided with grooves for exposing the base substrate. Since a total depth of the groove is the sum of the thicknesses of the first insulating layer, the second insulating layer, the third insulating layer, the fourth insulating layer, the fifth insulating layer and the first flat layer, not only the heights of positions on the deposited metal thin film are different, but also the metal thin films has large height differences, resulting in incomplete etching of the metal thin film in the patterning process, and metal block residue on the bottom and step surfaces of the groove after the patterning process. In addition, because the groove makes the deposited metal thin film directly contact with the flexible base substrate, the metal reacts with the organic material and produces particles, so there is a problem that the particles pollute the equipment. In the present disclosure, although the composite insulating layer in the cutting region is also provided with grooves, the first flat layer in the present disclosure is set to completely fill the grooves of the composite insulating layer, and the height difference of the groove region is eliminated by using the first flat layer. In the subsequent deposition of the metal thin film, because the cutting region has a flat surface, the heights of positions on the deposited metal thin film are similar, so that the metal block residue in the patterning process of the metal thin film is avoided, and neither Ag particles will appear in the subsequent process, nor the case that Ag particle being attached everywhere will take place. In addition, because the grooves are filled with the first flat layer, the metal thin film deposited later does not directly contact with the flexible base substrate, which not only avoids the chemical reaction between metal and organic materials which generates particles, but also protects the flexible base substrate from metal corrosion. The preparation process according to the present disclosure can be realized by using the existing mature preparation equipment, has little improvement on the existing process, can be well compatible with the existing preparation process, and has advantages of simple process realization, easy implementation, high production efficiency, low production cost and high yield rate. In a word, the present disclosure effectively avoids the defect of dark spots caused by metal block residue and particle pollution, thus ensuring the product yield rate and improves the product quality.

The description of the structure and preparation process of the display substrate according to the present disclosure is merely illustrative. In an exemplary embodiment, according to actual needs corresponding structures may be changed and patterning processes may be added or reduced. For example, an OLED may have a top emission structure, or may have a bottom emission structure. For another example, the driving transistor may have a top gate structure, a bottom gate structure, or a single gate structure, or a dual gate structure. For another example, other electrodes, leads, and structural film layers may be disposed in the driving structure layer, and the present application is not specifically limited thereto.

The present disclosure further provides a display mother plate, which includes a substrate region 300 and a cutting region 400 located at the periphery of the substrate region 300. As shown in FIG. 4 to FIG. 16, the display mother plate includes a driving structure layer arranged in the substrate region and the cutting region, and a first flat layer arranged on the driving structure layer; the driving structure layer of the cutting region includes a composite insulating layer, the composite insulating layer is provided with a groove, and the first flat layer fills the groove.

In an exemplary embodiment, the composite insulating layer includes multiple stacked inorganic insulating layers, and the groove exposes the flexible base substrate.

In an exemplary embodiment, the driving structure layer of the substrate region includes a first insulating layer disposed on a flexible base substrate, an active layer disposed on the first insulating layer, a second insulating layer covering the active layer, a first metal gate layer disposed on the second insulating layer, a third insulating layer covering the first metal gate layer, a second metal gate layer disposed on the third insulating layer, a fourth insulating layer covering the second metal gate layer, a source-drain metal layer disposed on the fourth insulating layer, a fifth insulating layer covering the source-drain metal layer.

In an exemplary embodiment, the driving structure layer of the cutting region includes the first insulating layer, the second insulating layer, the third insulating layer, the fourth insulating layer and the fifth insulating layer stacked on the flexible base substrate; The flexible base substrate includes a first flexible layer, a first barrier layer, an amorphous silicon layer, a second flexible layer and a second barrier layer which are stacked; the first insulating layer is arranged on the second barrier layer, and the groove exposes the second barrier layer of the flexible base substrate.

In an exemplary embodiment, a total thickness of the first flexible layer, the first barrier layer, the amorphous silicon layer and the second flexible layer may be 15 μm to 20 μm, a thickness of the second barrier layer may be 0.4 μm to 0.7 μm, and a thickness of the first insulating layer may be 0.2 μm to 0.6 μm.

In an exemplary embodiment, the second barrier layer includes a first sublayer and a second sublayer stacked on the second flexible layer; the grooves include a first groove and a second groove, the first groove is disposed on the second sublayer of the second barrier layer and the first insulating layer and exposes the first sublayer of the second barrier layer of the flexible base substrate. The second groove is disposed on the second insulating layer, the third insulating layer, the fourth insulating layer and the fifth insulating layer, and exposes the first sublayer of the second barrier layer of the flexible base substrate and the first insulating layer, the orthographic projection of the second groove on the flexible base substrate includes the orthographic projection of the first groove on the flexible base substrate.

In an exemplary embodiment, the display mother plate further includes a metal conductive layer disposed on the first flat layer and a second flat layer covering the metal conductive layer.

In an exemplary embodiment, the depth of the first groove may be 0.2 μm to 1.3 μm, and the depth of the second groove may be 0.5 μm to 1.4 μm.

The present disclosure further provides a method for preparing a display substrate. In an exemplary embodiment, the method for preparing the display substrate may include:

S1, forming a driving structure layer on multiple substrate regions and a cutting region surrounding the substrate regions, wherein the driving structure layer of the cutting region includes a composite insulating layer arranged on a flexible base substrate, and the composite insulating layer forms a groove of a step structure;

S2, forming a first flat layer covering the driving structure layer, wherein the first flat layer fills the groove;

S3, cutting in the cutting region to form a display substrate, and forming a step structure in an edge region of the display substrate; wherein heights of steps in the step structure increase sequentially in a direction from the edge of the display substrate to the interior of the display substrate; the first flat layer covers the step structure, and the edge of the first flat layer is flush with the edge of the flexible base substrate.

In an exemplary embodiment, the composite insulating layer may include multiple stacked inorganic insulating layers, and the groove may expose the flexible base substrate.

In an exemplary embodiment, forming the driving structure layer in the cutting region in step S1 may include:

S11, sequentially forming the first insulating layer, the second insulating layer, the third insulating layer, the fourth insulating layer and the fifth insulating layer on the flexible base substrate;

S12, patterning the first insulating layer, the second insulating layer, the third insulating layer, the fourth insulating layer and the fifth insulating layer to form a groove exposing the flexible base substrate.

In an exemplary embodiment, the flexible base substrate may include a first flexible layer, a first barrier layer, an amorphous silicon layer, a second flexible layer and a second barrier layer which are stacked, wherein the second barrier layer may include a first sublayer and a second sublayer stacked on the second flexible layer; the first insulating layer may be formed on a second sublayer of the second barrier layer; and step S12 includes:

forming a second groove exposing the first insulating layer on the second insulating layer, the third insulating layer, the fourth insulating layer and the fifth insulating layer through a first patterning process;

forming a first groove exposing the first sublayer of the second barrier layer of the flexible base substrate on the second sublayer of the second barrier layer and the first insulating layer in the second groove through a second patterning process, the second groove exposing the first groove.

The present disclosure provides a method for preparing a display substrate, the grooves of the cutting region are completely filled by providing the first flat layer, which avoids metal block residue in the patterning process of the metal conductive layer, and neither Ag particles or granules will appear in the subsequent process, nor the case that Ag particles or granules are attached everywhere will take place, thus effectively avoiding the occurrence of the defect of dark spots on the display substrate. The preparation process according to the present disclosure can be realized by using the existing mature preparation equipment, has little improvement on the existing process, can be well compatible with the existing preparation process, and has advantages of simple process realization, easy implementation, high production efficiency, low production cost and high yield rate.

The present disclosure further provides a display device including the display substrate in the aforementioned embodiments. The display device may be any product or component with a display function such as a mobile phone, a tablet computer, a television, a display, a notebook computer, a digital photo frame, a navigator, etc.

The drawings of the present application only refer to structures involved in the present disclosure, and other structures may refer to general designs. Without conflict, the embodiments of the present disclosure, i.e., the features in the embodiments may be combined with each other to obtain a new embodiment.

Those of ordinary skills in the art will appreciate that modifications or equivalent substitutions may be made to the technical solutions of the present disclosure without departing from the spirit and scope of the technical solutions of the present application, all of which shall be included within the scope of the claims of the present application.

What we claim is:

1. A display substrate, comprising a flexible base substrate and a composite insulating layer arranged on the flexible base substrate, wherein an edge region of the display substrate comprises a step structure formed by the composite insulating layer; heights of steps in the step structure increase sequentially in a direction from an edge of the display substrate to interior of the display substrate; the edge region further comprises a first flat layer covering the step structure, and an edge of the first flat layer is flush with an edge of the flexible base substrate;

wherein the flexible base substrate comprises a first flexible layer, a first barrier layer, an amorphous silicon layer, a second flexible layer and a second barrier layer which are sequentially stacked, wherein the composite insulating layer comprises a first insulating layer, a second insulating layer, a third insulating layer, a fourth insulating layer and a fifth insulating layer which are stacked on the second barrier layer; a total thickness of the first flexible layer, the first barrier layer, the amorphous silicon layer and the second flexible layer is 15 μm to 20 μm, a thickness of the second barrier layer is 0.4 μm to 0.7 μm, and a thickness of the first insulating layer is 0.2 μm to 0.6 μm;

wherein the second barrier layer comprises a first sublayer and a second sublayer stacked on the second flexible layer; the step structure comprises a first step, a second step and a third step, the first step comprises the first flexible layer, the first barrier layer, the amorphous silicon layer, the second flexible layer and the first sublayer of the second barrier layer, the second step comprises the second sublayer of the second barrier layer and the first insulating layer, and the third step comprises the second insulating layer, the third insulating layer, the fourth insulating layer and the fifth insulating layer; a distance between an upper surface of the first step and a reference surface is 0.05 μm to 0.06 μm, a distance between an upper surface of the second step and the reference surface is 0.75 μm to 0.95 μm, and a distance between an upper surface of the third step and the reference surface is 1.40 μm to 1.80 μm, wherein the reference surface is a surface of a side of the first sublayer adjacent to the second flexible layer.

2. The display substrate of claim 1, wherein a thickness of the first step is greater than a thickness of the second step, and the thickness of the first step is greater than a thickness of the third step.

3. The display substrate of claim 2, wherein the thickness of the first step is 15 μm to 20.7 μm, the thickness of the second step is 0.2 μm to 1.3 μm, and the thickness of the third step is 0.5 μm to 1.4 μm.

4. The display substrate of claim 2, wherein the edge region of the display substrate further comprises a second flat layer arranged on the first flat layer, and an orthographic projection of the second flat layer on the flexible base substrate partially overlaps with orthographic projections of the first step and the second step on the flexible base substrate.

5. The display substrate of claim 4, wherein in a direction from the interior of the display substrate to the edge of the display substrate, a width of overlapping between the orthographic projection of the second flat layer on the flexible base substrate and the orthographic projection of the first step on the flexible base substrate is 10 μm to 20 μm, and a width of overlapping between the orthographic projection of the second flat layer on the flexible base substrate and an orthographic projection of the second step on the flexible base substrate is 20 μm to 30 μm.

6. The display substrate of claim 1, wherein sidewalls of the second step and the third step are slopes, and an included angle between a generatrix of the slopes and a normal direction of the display substrate is 20 to 50 degrees.

7. The display substrate of claim 1, wherein a distance from an edge of the first step to an edge of the second step is greater than a distance from the edge of the second step to an edge of the third step, and the distance from the edge of the first step to the edge of the second step is greater than a distance from the edge of the third step to an edge of a crack dam.

8. The display substrate of claim 7, wherein the distance from the edge of the first step to the edge of the second step is 55 μm to 210 μm, the distance from the edge of the second step to the edge of the third step is 5 μm to 40 μm, and the distance from the edge of the third step to the edge of the crack dam is 5 μm to 15 μm.

9. The display substrate of claim 1, wherein a crack dam is further arranged on the composite insulating layer of the edge region, and the crack dam comprises a plurality of cracks arranged at intervals, the cracks expose the first insulating layer, and the first flat layer covers the crack dam.

10. The display substrate of claim 1, wherein the edge region of the display substrate comprises a peripheral region and an inner cutting region, and the inner cutting region is located on one side of the peripheral region away from a substrate region, the step structure is arranged in the inner cutting region, and a crack dam is arranged in the peripheral region.

11. The display substrate of claim 10, wherein the substrate region of the display substrate comprises a display region and a binding region arranged on one side of the display region, an edge region of the binding region on one side away from the display region forms a stair structure, which comprises a first stair and a second stair, the first stair is formed by the flexible base substrate and the composite insulating layer, the edge region of the display substrate further comprises a second flat layer arranged on the first flat layer, and the second stair is formed by the first flat layer and the second flat layer; the step structure is arranged in other edge regions of the binding region and the display region except the edge region of the binding region on the side away from the display region.

12. The display substrate of claim 1, wherein a substrate region of the display substrate comprises the first insulating layer arranged on the flexible base substrate, an active layer arranged on the first insulating layer, the second insulating layer covering the active layer, a first metal gate layer arranged on the second insulating layer, the third insulating layer covering the first metal gate layer, a second metal gate layer arranged on the third insulating layer, the fourth insulating layer covering the second metal gate layer, a source-drain metal layer arranged on the fourth insulating layer, the fifth insulating layer covering the source-drain metal layer, a metal conductive layer arranged on the first flat layer, and a second flat layer covering the metal conductive layer.

13. A display mother plate, comprising a plurality of substrate regions and a cutting region surrounding the substrate regions; wherein the display mother plate comprises a driving structure layer arranged in the substrate regions and the cutting region, and a first flat layer arranged on the driving structure layer; the driving structure layer of the cutting region comprises a composite insulating layer, the composite insulating layer is provided with grooves, and the first flat layer is set to completely fill the grooves;

wherein the display mother plate, when cut, forms a display substrate comprising a flexible base substrate and the composite insulating layer arranged on the flexible base substrate, wherein an edge region of the display substrate comprises a step structure formed by the composite insulating layer; heights of steps in the step structure increase sequentially in a direction from an edge of the display substrate to interior of the display substrate; the edge region further comprises the first flat layer covering the step structure, and an edge of the first flat layer is flush with an edge of the flexible base substrate;

wherein the flexible base substrate comprises a first flexible layer, a first barrier layer, an amorphous silicon layer, a second flexible layer and a second barrier layer which are sequentially stacked, wherein the composite insulating layer comprises a first insulating layer, a second insulating layer, a third insulating layer, a fourth insulating layer and a fifth insulating layer which are stacked on the second barrier layer; a total thickness of the first flexible layer, the first barrier layer, the amorphous silicon layer and the second flexible layer is 15 μm to 20 μm, a thickness of the second barrier layer is 0.4 μm to 0.7 μm, and a thickness of the first insulating layer is 0.2 μm to 0.6 μm;

wherein the second barrier layer comprises a first sublayer and a second sublayer stacked on the second flexible layer; the step structure comprises a first step, a second step and a third step, the first step comprises the first flexible layer, the first barrier layer, the amorphous silicon layer, the second flexible layer and the first sublayer of the second barrier layer, the second step comprises the second sublayer of the second barrier layer and the first insulating layer, and the third step comprises the second insulating layer, the third insulating layer, the fourth insulating layer and the fifth insulating layer; a distance between an upper surface of the first step and a reference surface is 0.05 μm to 0.06 μm, a distance between an upper surface of the second step and the reference surface is 0.75 μm to 0.95 μm, and a distance between an upper surface of the third step and the reference surface is 1.40 μm to 1.80 μm, wherein the reference surface is a surface of a side of the first sublayer adjacent to the second flexible layer.

14. The display mother plate of claim 13, wherein the driving structure layer of the substrate regions comprises the first insulating layer arranged on the flexible base substrate, an active layer arranged on the first insulating layer, the second insulating layer covering the active layer, a first metal gate layer arranged on the second insulating layer, the third insulating layer covering the first metal gate layer, a second metal gate layer arranged on the third insulating layer, the fourth insulating layer covering the second metal gate layer, a source-drain metal layer arranged on the fourth insulating layer, the fifth insulating layer covering the source-drain metal layer; the driving structure layer of the cutting region comprises the first insulating layer, the second insulating layer, the third insulating layer, the fourth insulating layer and the fifth insulating layer stacked on the flexible base substrate.

15. The display mother plate of claim 14, wherein the grooves comprise a first groove and a second groove, the first groove is arranged on the second sublayer of the second barrier layer and the first insulating layer and exposes the first sublayer of the second barrier layer, the second groove is arranged on the second insulating layer, the third insulating layer, the fourth insulating layer and the fifth insulating layer, and exposes the first sublayer of the second barrier layer and the first insulating layer, an orthographic projection of the second groove on the flexible base substrate contains an orthographic projection of the first groove on the flexible base substrate; a depth of the first groove is 0.2 μm to 1.3 μm, and a depth of the second groove is 0.5 μm to 1.4 μm.

16. A method for preparing a display substrate, comprising:
- forming a driving structure layer on multiple substrate regions and a cutting region surrounding the substrate regions, wherein the driving structure layer of the cutting region includes a composite insulating layer arranged on a flexible base substrate, and the composite insulating layer forms grooves of a step structure;
- forming a first flat layer covering the driving structure layer, wherein the first flat layer is set to completely fill the grooves; and
- cutting in the cutting region to form a display substrate, and forming a step structure in an edge region of the display substrate; wherein heights of steps in the step structure increase sequentially in a direction from an edge of the display substrate to interior of the display substrate; the first flat layer covers the step structure, and an edge of the first flat layer is flush with an edge of the flexible base substrate;
- wherein the display substrate comprises the flexible base substrate and the composite insulating layer arranged on the flexible base substrate, wherein the step structure in the edge region of the display substrate is formed by the composite insulating layer;
- wherein the flexible base substrate comprises a first flexible layer, a first barrier layer, an amorphous silicon layer, a second flexible layer and a second barrier layer which are sequentially stacked, wherein the composite insulating layer comprises a first insulating layer, a second insulating layer, a third insulating layer, a fourth insulating layer and a fifth insulating layer which are stacked on the second barrier layer; a total thickness of the first flexible layer, the first barrier layer, the amorphous silicon layer and the second flexible layer is 15 μm to 20 μm, a thickness of the second barrier layer is 0.4 μm to 0.7 μm, and a thickness of the first insulating layer is 0.2 μm to 0.6 μm;
- wherein the second barrier layer comprises a first sublayer and a second sublayer stacked on the second flexible layer; the step structure comprises a first step, a second step and a third step, the first step comprises the first flexible layer, the first barrier layer, the amorphous silicon layer, the second flexible layer and the first sublayer of the second barrier layer, the second step comprises the second sublayer of the second barrier layer and the first insulating layer, and the third step comprises the second insulating layer, the third insulating layer, the fourth insulating layer and the fifth insulating layer; a distance between an upper surface of the first step and a reference surface is 0.05 μm to 0.06 μm, a distance between an upper surface of the second step and the reference surface is 0.75 μm to 0.95 μm, and a distance between an upper surface of the third step and the reference surface is 1.40 μm to 1.80 μm, wherein the reference surface is a surface of a side of the first sublayer adjacent to the second flexible layer.

17. The method for preparing a display substrate of claim 16, wherein forming the driving structure layer in the cutting region comprises:
- sequentially forming the first insulating layer, the second insulating layer, the third insulating layer, the fourth insulating layer and the fifth insulating layer on the flexible base substrate; wherein the first insulating layer is formed on the second sublayer of the second barrier layer;
- forming a second groove exposing the first insulating layer on the second insulating layer, the third insulating layer, the fourth insulating layer and the fifth insulating layer through a first patterning process; and
- forming a first groove exposing the first sublayer of the second barrier layer on the second sublayer of the second barrier layer and the first insulating layer in the second groove through a second patterning process, the second groove exposing the first groove.

* * * * *